US012733232B2

(12) United States Patent
Lee et al.

(10) Patent No.: US 12,733,232 B2
(45) Date of Patent: Sep. 8, 2026

(54) CAP FOR GATE STACK OF MULTIGATE DEVICE

(71) Applicant: Taiwan Semiconductor Manufacturing Company, Ltd., Hsin-Chu (TW)

(72) Inventors: Chih-Wei Lee, New Taipei City (TW); Hsin-Han Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 521 days.

(21) Appl. No.: 18/318,032

(22) Filed: May 16, 2023

(65) Prior Publication Data

US 2024/0387688 A1 Nov. 21, 2024

(51) Int. Cl.

| | |
|---|---|
| ***H10D 64/01*** | (2025.01) |
| ***H10D 30/67*** | (2025.01) |
| ***H10D 62/10*** | (2025.01) |
| ***H10D 64/68*** | (2025.01) |
| ***H10D 84/01*** | (2026.01) |

(Continued)

(52) U.S. Cl.

CPC ....... *H10D 64/017* (2025.01); *H10D 30/6735* (2025.01); *H10D 62/121* (2025.01); *H10D 64/01318* (2026.01); *H10D 64/693* (2025.01); *H10D 84/014* (2025.01); *H10D 84/038* (2025.01); *H10D 84/83* (2025.01)

(58) Field of Classification Search

CPC ............... H10D 64/017; H10D 62/121; H10D 30/6735; H10D 84/038; H10D 84/83; H10D 84/014; H10D 64/693; H10D 64/01318; H01L 21/28088

USPC .......................................................... 257/410

See application file for complete search history.

(56) References Cited

U.S. PATENT DOCUMENTS

2006/0118910 A1* 6/2006 Jin ......................... H10D 86/85 257/E29.255
2013/0026578 A1* 1/2013 Tsau ..................... H10D 84/038 257/E27.06

(Continued)

FOREIGN PATENT DOCUMENTS

| | | |
|---|---|---|
| CN | 110600370 A | 12/2019 |
| TW | 201916125 A | 4/2019 |

*Primary Examiner* — Norman D Richards
*Assistant Examiner* — Colin Russell Mccutcheon
(74) *Attorney, Agent, or Firm* — HAYNES AND BOONE, LLP

(57) ABSTRACT

An exemplary method for forming a gate stack of a multigate device includes forming a gate dielectric layer, forming a work function layer over the gate dielectric layer, forming a cap over the work function layer, and forming a gate electrode layer over the cap. Forming the cap includes forming a first portion of a first capping layer over the work function layer, performing an oxygen control treatment, forming a second portion of the first capping layer over the first portion of the first capping layer, and forming a second capping layer over the first capping layer. The oxygen control treatment exposes the first portion of the first capping layer to: oxygen by breaking vacuum, ozonated deionized water, oxygen radicals, an oxygen-containing annealing environment, or a combination thereof. The first capping layer can be a metal nitride layer, and the second capping layer can be a silicon layer.

20 Claims, 27 Drawing Sheets

(51) Int. Cl.

| | |
|---|---|
| ***H10D 84/03*** | (2025.01) |
| ***H10D 84/83*** | (2025.01) |

(56) References Cited

U.S. PATENT DOCUMENTS

| | | | | |
|---|---|---|---|---|
| 2015/0069533 | A1 * | 3/2015 | Lin | H10D 30/601 257/410 |
| 2016/0365347 | A1 * | 12/2016 | Bao | H10D 86/011 |
| 2018/0166274 | A1 * | 6/2018 | Lin | H01L 21/02247 |
| 2021/0036147 | A1 * | 2/2021 | Wang | H10D 64/66 |
| 2021/0098457 | A1 * | 4/2021 | Cheng | H10D 84/83 |

* cited by examiner

CAP FOR GATE STACK OF MULTIGATE DEVICE

BACKGROUND

Multigate devices have been introduced to meet the semiconductor integrated circuit (IC) industry's ever-increasing demand for smaller and faster electronic devices that can simultaneously support a greater number of increasingly complex and sophisticated functions. A multigate device has a gate that extends, partially or fully, around a channel region to provide access to the channel region on at least two sides. Exemplary multi-gate devices include fin-like field effect (FinFET) transistors, gate-all-around (GAA) transistors (e.g., nanostructure-based (e.g., nanowire, nanosheet, or nanobar) transistors), other three-dimensional (3D) transistors (e.g., forksheet transistors), or a combination thereof. Multigate devices enable aggressive scaling down of IC technologies and have been observed to improve gate control, increase gate-channel coupling, reduce off-state current, and reduce short-channel effects (SCEs), while seamlessly integrating with conventional IC manufacturing processes.

However, as IC technology nodes continue to scale, fabricating gate stacks around a channel region of a multigate device has become challenging. For example, a gate stack of a multigate device is often formed using a gate replacement process that includes removing a dummy gate to form a gate opening that exposes a channel layer(s) and filling the gate opening with various gate layers, such as a gate dielectric and a gate electrode. Decreasing device feature sizes have led to decreasing gate opening dimensions and thus reduced gate stack volume. As a result, gate layers wrapping the channel layer(s) may easily fill the gate opening and/or spaces between adjacent channel layers, which leaves limited room in the gate opening for fine tuning threshold voltage (Vt) of the multigate device, for example, by using multiple work function layers and/or a thicker work function layer. Various combinations and/or configurations of layers have been explored in gate stacks to maximize multigate device performance while minimizing performance mismatch, such as threshold voltage variations ($\sigma$Vt), between multigate devices of an IC, such as those forming a memory. Although existing gate stack configurations for multigate devices and methods of fabrication thereof have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-17A and FIGS. 3B-17B are cross-sectional views of a device, such as a transistor, in portion or entirety, at various fabrication stages associated with the methods of FIG. 1A and FIG. 1B, according to various aspects of the present disclosure.

FIGS. 18A-20A and FIGS. 18B-20B are cross-sectional views of a device, such as a transistor, in portion or entirety, at various fabrication stages associated with the methods of FIG. 1A and FIG. 1B, according to various aspects of the present disclosure.

DETAILED DESCRIPTION

Figure 1A:
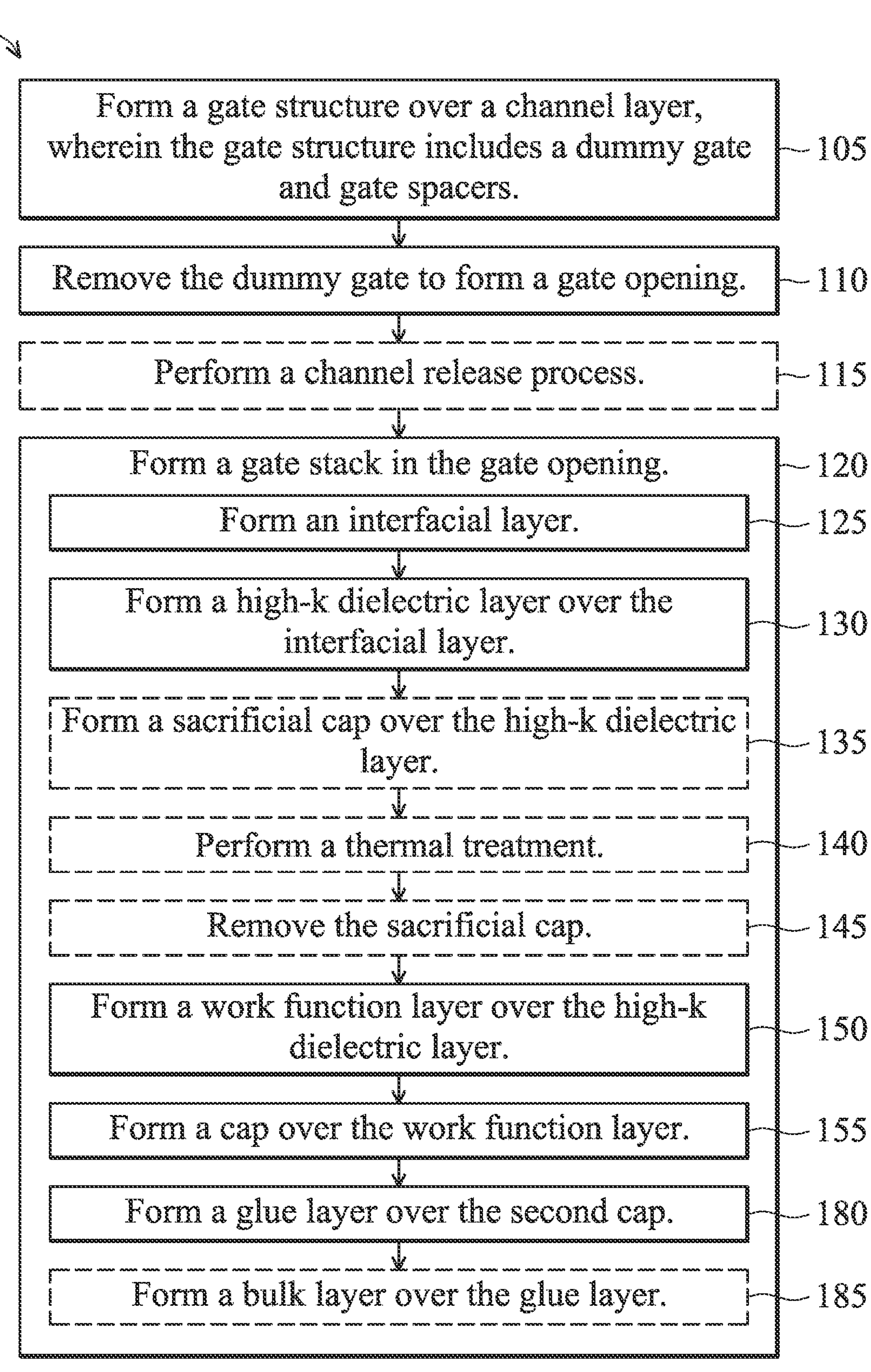
FIG. 1A is a flow chart of a method for fabricating a device having a gate stack, in portion or entirety, according to various aspects of the present disclosure.

The present disclosure relates generally to integrated circuit (IC) devices, and more particularly, to gate stacks of transistors and methods of fabrication thereof.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower." "upper," "horizontal," "vertical," "above," "over," "below," "beneath," "up," "down," "top." "bottom," etc. as well as derivatives thereof (e.g., "horizontally." "downwardly." "upwardly," etc.) are used for case of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

Multigate devices, such as fin-like field effect transistors (FinFETs), gate-all-around (GAA) transistors, forksheet transistors, and other non-planar transistors, have gained popularity due to their enhanced performance compared to conventional planar transistors. As multigate device dimensions shrink to facilitate further IC technology node scaling, conventional multigate device fabrication methods face challenges. For example, unintentional and/or undesirable oxidation of gate stack layers, such as a work function layer and/or a gate dielectric layer, during a gate replacement process can lead to performance degradations, such as slower device speed and/or or threshold voltage ($V_t$) variation. This problem is exacerbated for certain IC applications, such as in static random-access memory (SRAM) devices, where n-type transistor performance may be more important than p-type transistor performance.

To address these challenges, the present disclosure proposes a gate stack fabrication method that can mitigate unintentional and/or undesirable oxidation of gate stack layers, such as the work function layer and/or the gate dielectric layer, by reducing oxygen vacancies of a work function layer cap of the gate stack. For example, the proposed gate stack fabrication method breaks vacuum when forming the work function layer cap, such that metal-oxygen bonds are increased in at least a portion of the work function layer cap, which reduces oxygen vacancies therein. Such process enables controlled oxidation of the work function layer cap and thus reduces likelihood of additional oxidation occurring in the work function layer cap, the work function layer, the gate dielectric layer, or a combination thereof. As such, the ex-situ work function layer cap, along with its corresponding gate stack fabrication method, disclosed herein can improve device performance, for example, by providing faster device speeds and/or smaller threshold voltage variations, particularly for IC applications, such as in SRAMs. Details of improved gate stacks for multigate devices and methods of fabrication and/or design thereof are described herein in the following pages. Different embodiments may have different advantages, and no particular advantage is required of any embodiment.

Figure 1B:
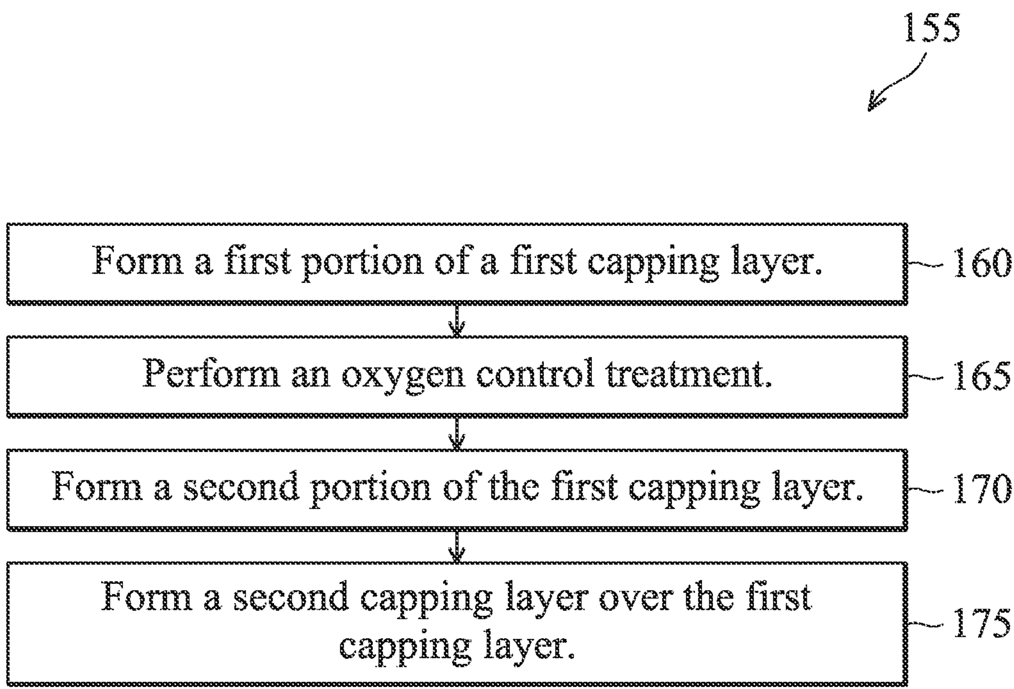
FIG. 1B is a flow chart of a method for fabricating a cap of a gate stack, in portion or entirety, which can be implemented in the method for fabricating the device having the gate stack of FIG. 1A, according to various aspects of the present disclosure.
Figure 2:
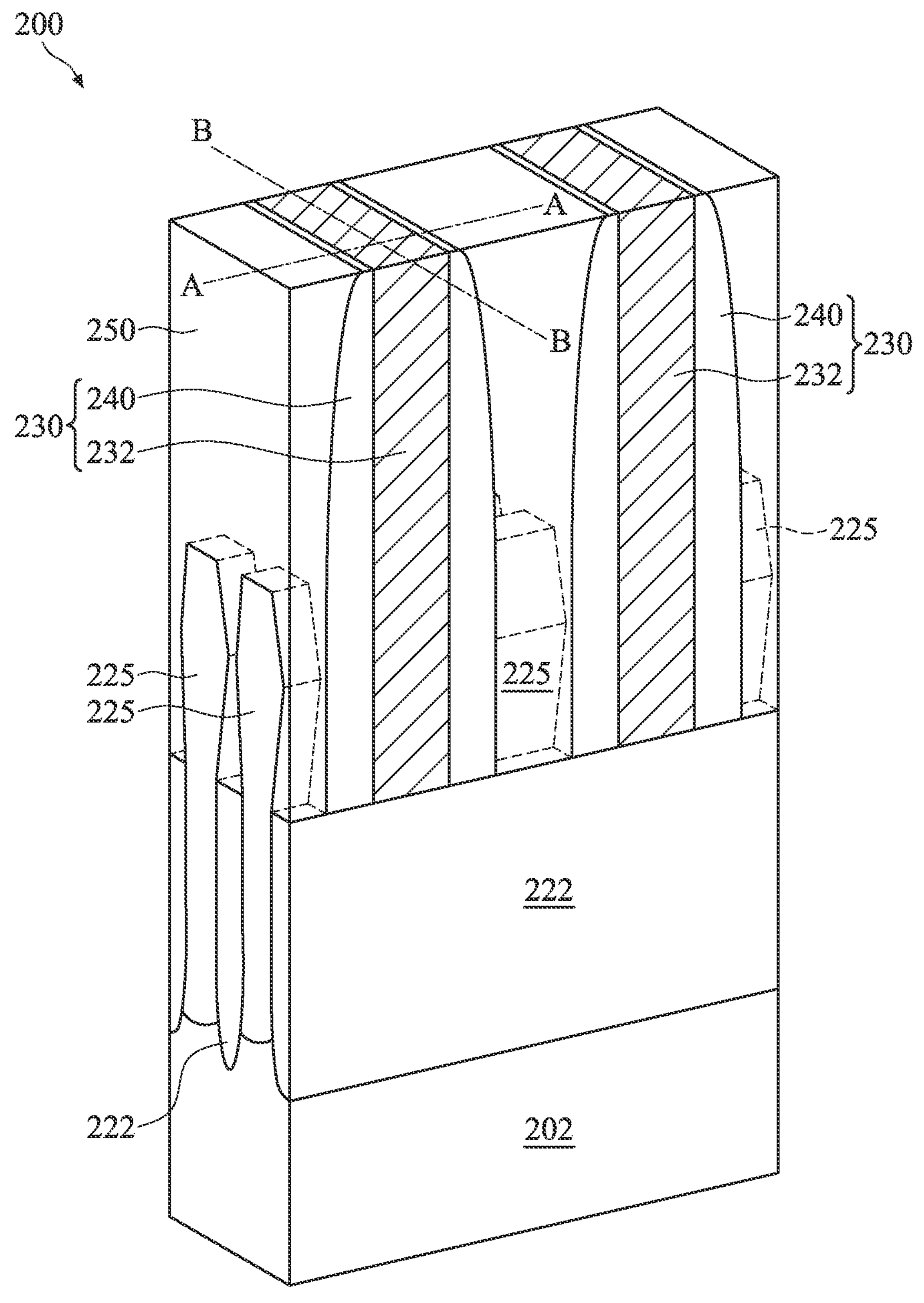
FIG. 2 is a perspective view of a device, such as a transistor, in portion or entirety, at a fabrication stage associated with a method for fabricating a device having a gate stack, such as the method of FIG. 1A, according to various aspects of the present disclosure.
Figure 3B:
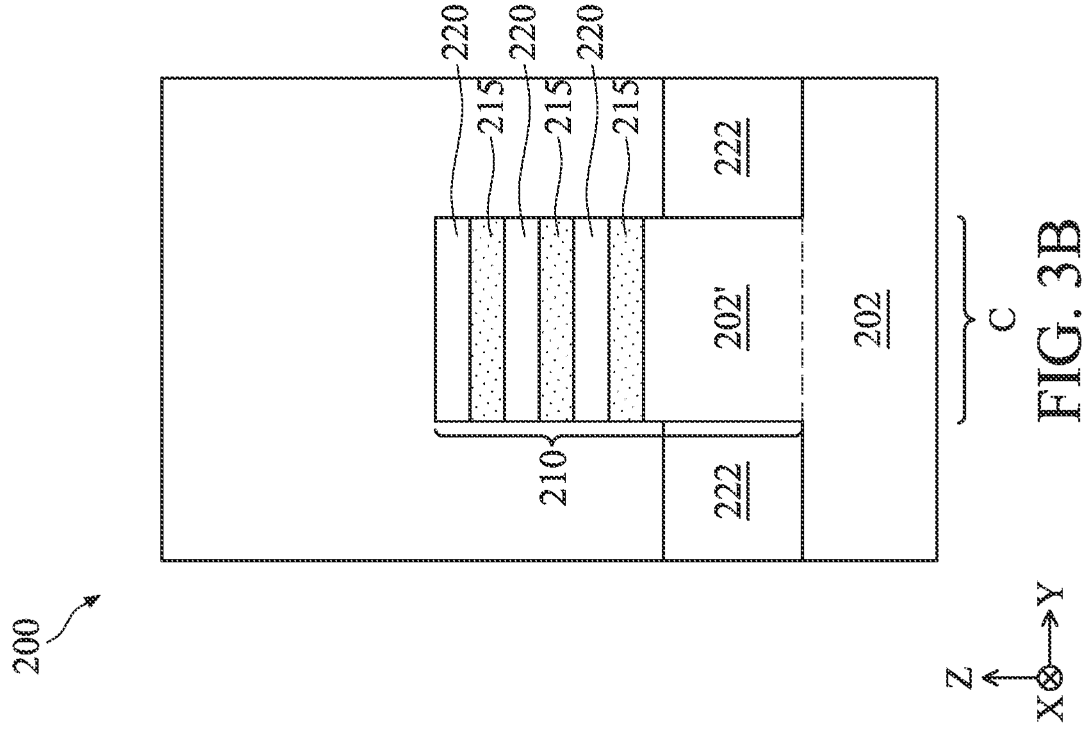
Figure 3A:
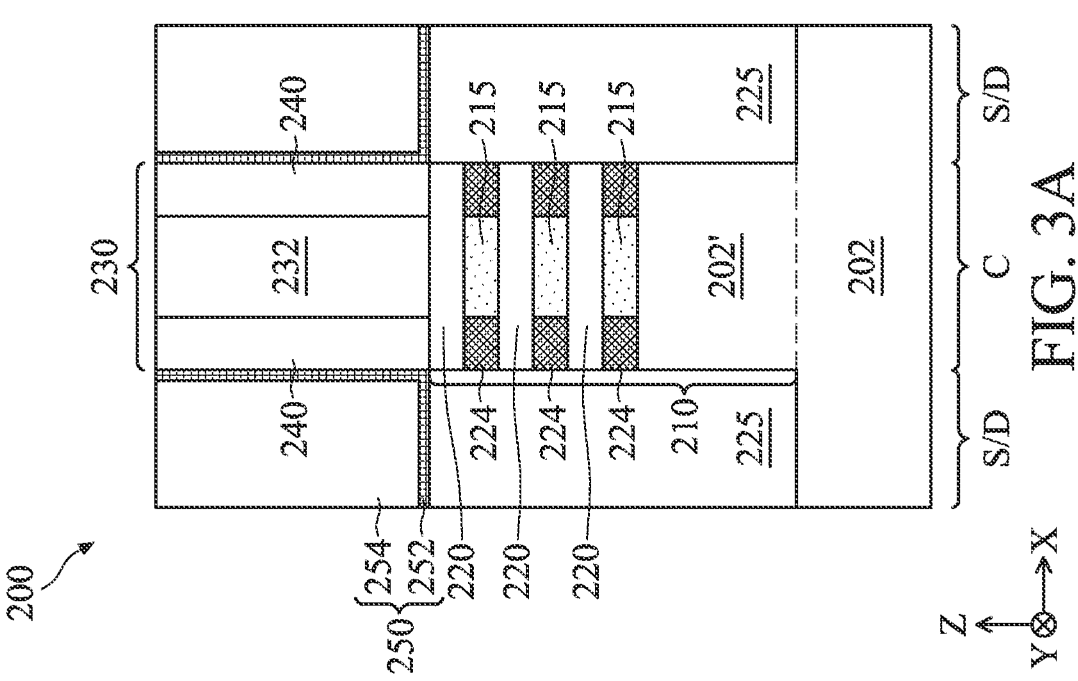

FIG. 1A is a flow chart of a method 100 for fabricating a device having a gate stack, in portion or entirety, according to various aspects of the present disclosure. FIG. 1B is a flow chart of a method for fabricating a cap of a gate stack, in portion or entirety, according to various aspects of the present disclosure. The method of FIG. 1B can be implemented in method 100 of FIG. 1A. FIG. 2 is a perspective view of a device 200, in portion or entirety, at a fabrication stage associated with method 100 for fabricating a device having a gate stack, such as method 100 of FIG. 1A, according to various aspects of the present disclosure. FIGS. 3A-17A and FIGS. 3B-17B are cross-sectional views of device 200, in portion or entirety, at various fabrication stages associated with method 100 of FIG. 1A and/or the method of FIG. 1B, according to various aspects of the present disclosure. For example, FIG. 3A and FIG. 3B are cross-sectional views of device 200 along line A-A and line B-B, respectively, of FIG. 2, FIGS. 4B-17B are cross-sectional views of device 200 along line A-A of FIG. 2 at subsequent fabrication stages associated with method 100 of FIG. 1A and/or the method of FIG. 1B, and FIGS. 4B-17B are cross-sectional views of device 200 along line B-B of FIG. 2 at subsequent fabrication stages associated with method 100 of FIG. 1A and/or the method of FIG. 1B. FIG. 1A, FIG. 1B, FIG. 2, FIGS. 3A-17A, and FIGS. 3B-17B are discussed concurrently herein for ease of description and understanding. FIG. 1A, FIG. 1B, FIG. 2, FIGS. 3A-17A, and FIGS. 3B-17B have been simplified for the sake of clarity to better understand the inventive concepts of the present disclosure. Additional steps can be provided before, during, and after method 100 of FIG. 1A and/or the method of FIG. 1B, and some of the steps described can be moved, replaced, or eliminated for additional embodiments of method 100 of FIG. 1A and/or the method of FIG. 1B. Additional features can be added in device 200, and some of the features described below can be replaced, modified, or eliminated in other embodiments of device 200.

Turning to FIG. 1A, FIG. 2, FIG. 3A, and FIG. 3B, method 100 at block 105 includes forming a gate structure over a channel layer. The gate structure includes a dummy gate and gate spacers. This can include receiving and/or forming a device precursor that includes a substrate (wafer) 202, a channel layer 210 (depicted as having a mesa 202' (i.e., a patterned, projecting portion of substrate 202), semiconductor layers 215, and semiconductor layers 220), an isolation feature 222, inner spacers 224, epitaxial source/drains 225, a gate structure 230 (depicted as having a dummy gate 232 and gate spacers 240), and a dielectric layer 250. Channel layer 210 is in a channel region C, and epitaxial source/drains 225 are in source/drain regions S/D. Semiconductor layers 220 and mesa 202' of channel layer 210 extend between epitaxial source/drains 225 along the x-direction, and inner spacers 224 are between semiconductor layers 215 and epitaxial source/drains 225. Gate structure 230 is disposed over channel layer 210 and between epitaxial source/drains 225. In the X-Z plane, gate structure 230 is on a top of channel layer 210. In the Y-Z plane, gate structure 230 is on a top and sides of channel layer 210. For example, gate structure 230 wraps channel layer 210 in the Y-Z plane.

Substrate 202 includes an elementary semiconductor, such as silicon and/or germanium; a compound semiconductor, such as silicon carbide, gallium arsenide, gallium phosphide, indium phosphide, indium arsenide, indium antimonide, or a combination thereof; an alloy semiconductor, such as SiGe, GaAsP, AlInAs, AlGaAs, GaInAs, GaInP, GaInAsP, or a combination thereof; or a combination thereof. In the depicted embodiment, substrate 202 is a silicon substrate. In some embodiments, substrate 202 is a semiconductor-on-insulator substrate, such as a silicon-on-insulator (SOI) substrate, a silicon germanium-on-insulator (SGOI) substrate, or a germanium-on-insulator (GOI) substrate. Substrate 202 (and mesa 202') can include various doped regions, such as p-type doped regions (e.g., p-wells), n-type doped regions (e.g., n-wells), or a combination thereof. N-type doped regions include n-type dopants, such as phosphorus, arsenic, other n-type dopant, or a combination thereof. P-type doped regions include p-type dopants, such as boron, indium, other p-type dopant, or a combination thereof. In some embodiments, the doped regions include a combination of p-type dopants and n-type dopants. The doped regions can be formed directly on and/or in substrate 202, for example, providing a p-well structure, an n-well structure, a dual-well structure, a raised structure, other suitable structure, or a combination thereof. In some embodiments, substrate 202, mesa 202', and semiconductor layers thereover include an n-well, such as where transistor 200 is a p-type transistor, or a p-well, such as where transistor 200 is an n-type transistor.

Channel layer 210 extends along the x-direction, having a length along the x-direction, a width along a y-direction, and a height along a z-direction. Semiconductor layers 215 and semiconductor layers 220 are stacked vertically (e.g., along the z-direction) in an interleaving and/or alternating configuration from a top surface of substrate 202. A composition of semiconductor layers 215 is different than a composition of semiconductor layers 220 to achieve etching selectivity and/or different oxidation rates during subsequent processing. Semiconductor layers 215 and semiconductor layers 220 include different materials, constituent atomic percentages, constituent weight percentages, thicknesses, or a combination thereof to achieve desired etching selectivity during an etching process, such as an etch process implemented to form suspended channel layers in channel region C. For example, semiconductor layers 215 include silicon germanium, semiconductor layers 220 include silicon, and a silicon etch rate of semiconductor layers 220 is different than a silicon germanium etch rate of semiconductor layers 215 to a given etchant. In some embodiments, semiconductor layers 215 and semiconductor layers 220 include the same material but different constituent atomic percentages to achieve etching selectivity. For example, semiconductor layers 215 and semiconductor layers 220 include silicon germanium with different silicon atomic percentages and/or different germanium atomic percentages. The present disclosure contemplates semiconductor layers 215 and semiconductor layers 220 including any combination of semiconductor materials that provides desired etching selectivity, desired oxidation rate differences, desired performance characteristics (e.g., materials that maximize current flow), or a combination thereof, including any of the semiconductor materials disclosed herein.

Isolation feature 222 electrically isolates active device regions and/or passive device regions of a device from one another. For example, isolation feature 222 separates and electrically isolates an active region of transistor 200 (for example, channel layer 210 and/or epitaxial source/drains 225 thereof) from other device regions and/or devices. Isolation feature 222 includes silicon oxide, silicon nitride, silicon oxynitride, other suitable isolation material (including, for example, silicon, oxygen, nitrogen, carbon, other suitable isolation constituent, etc.), or a combination thereof. Isolation feature 222 may have a multilayer structure. For example, isolation feature 222 includes a bulk dielectric (e.g., an oxide layer) over a dielectric liner (including, for example, silicon nitride, silicon oxide, silicon oxynitride, silicon oxycarbonitride, or a combination thereof). In another example, isolation feature 222 includes a dielectric layer over a doped liner, such as a boron silicate glass (BSG) liner and/or a phosphosilicate glass (PSG) liner. Dimensions and/or characteristics of isolation feature 222 are configured to provide a shallow trench isolation (STI) structure, a deep trench isolation (DTI) structure, a local oxidation of silicon (LOCOS) structure, other suitable isolation structure, or a combination thereof. In the depicted embodiment, isolation feature 222 can be an STI.

Inner spacers 224 are disposed under gate spacers 240 and along sidewalls of semiconductor layers 215. Inner spacers 224 are disposed between and separate semiconductor layers 215 and epitaxial source/drains 225. Inner spacers 224 are further disposed between adjacent semiconductor layers 220 and between bottommost semiconductor layer 220 and mesa 202'. Inner spacers 224 include a dielectric material that includes silicon, oxygen, carbon, nitrogen, other suitable constituent, or a combination thereof, such as silicon nitride, silicon oxynitride, silicon carbide, silicon oxycarbide, silicon oxycarbonitride, etc. In some embodiments, inner spacers 224 include a low-k dielectric material. In some embodiments, dopants (for example, p-type dopants, n-type dopants, or a combination thereof) are introduced into the dielectric material, and inner spacers 224 include doped dielectric material(s).

Epitaxial source/drains 225 include a semiconductor material and can be doped with n-type dopants and/or p-type dopants. When forming a portion of a p-type transistor, epitaxial source/drains 225 can include silicon germanium or germanium doped with boron, other p-type dopant, or a combination thereof. When forming a portion of an n-type transistor, epitaxial source/drains 225 can include silicon doped with carbon, phosphorous, arsenic, other n-type dopant, or a combination thereof. Epitaxial source/drains 225 can include more than one semiconductor layer, where the semiconductor layers include the same or different materials and/or the same or different dopant concentrations. Epitaxial source/drains 225 can include materials and/or dopants that achieve desired tensile stress and/or compressive stress in channel region C. In some embodiments, doped regions, such as heavily doped source/drain (HDD) regions, lightly doped source/drain (LDD) regions, other doped regions, or a combination thereof, are disposed in epitaxial source/drains 225. In some embodiments, doped regions, such as LDD regions, may extend into channel region C. As used herein, source/drain region, epitaxial source/drain, epitaxial source/drain feature, etc. may refer to a source of a device, a drain of a device, or a source and/or a drain of multiple devices.

Dummy gate 232 extends lengthwise in a direction that is different than (e.g., orthogonal to) the lengthwise direction of channel layer 210. For example, dummy gate 232 extends lengthwise along the y-direction, having a length along the y-direction, a width along the x-direction, and a height along the z-direction. In the X-Z plane, dummy gate 232 is disposed on a top of channel layer 210. In the Y-Z plane, dummy gate 232 is disposed over a top and sidewalls of channel layer 210, such that dummy gate 232 wraps channel layer 210. Dummy gate 232 can include a dummy gate electrode and a dummy gate dielectric. The dummy gate electrode includes a suitable dummy gate material, and the dummy gate dielectric includes a suitable dielectric material.

For example, the dummy gate electrode includes polysilicon (i.e., a poly gate) and the dummy gate dielectric includes silicon oxide (i.e., a dummy oxide). Dummy gate 232 can include additional layers, such as a hard mask layer, a capping layer, an interface layer, a diffusion layer, a barrier layer, other suitable layer, or a combination thereof.

Gate spacers 240 are adjacent to and along sidewalls of dummy gate 232. Gate spacers 240 can include seal spacers, offset spacers, sacrificial spacers, dummy spacers, main spacers, other suitable spacers, or a combination thereof. Gate spacers 240 can have single layer structures or multi-layer structures. Gate spacers 240 include a dielectric material, which can include silicon, oxygen, carbon, nitrogen, other suitable constituent, or a combination thereof (e.g., silicon oxide, silicon nitride, silicon oxynitride, silicon carbide, silicon carbonitride, silicon oxycarbide, silicon oxycarbonitride, etc.). For example, gate spacers 240 can include silicon, oxygen, nitrogen, carbon, and hydrogen (i.e., gate spacers 240 are SiONCH layers).

Dielectric layer 250 is disposed over substrate 202, isolation feature 222, epitaxial source/drains 225, and gate structure 230. Dielectric layer 250 can have a multilayer structure, such as a contact etch stop layer (CESL) 252 an interlayer dielectric (ILD) layer 254. ILD layer 254 is formed over CESL 252. ILD layer 254 includes a dielectric material including, for example, silicon oxide, carbon doped silicon oxide, silicon nitride, silicon oxynitride, tetraethyl orthosilicate (TEOS)-formed oxide, BSG, PSG, borophosphosilicate glass (BPSG), fluorosilicate glass (FSG), Black Diamond® (Applied Materials of Santa Clara, California), xerogel, aerogel, amorphous fluorinated carbon, parylene, benzocyclobutene-based (BCB) dielectric material, SiLK (Dow Chemical, Midland, Michigan), polyimide, other suitable dielectric material, or a combination thereof. In some embodiments, ILD layer 254 includes a dielectric material having a dielectric constant that is less than a dielectric constant of silicon dioxide (e.g., k<3.9). In some embodiments, ILD layer 254 includes a dielectric material having a dielectric constant that is less than about 2.5 (i.e., an extreme low-k dielectric material), such as porous silicon oxide, silicon carbide, carbon-doped oxide (e.g., SiCOH-based material (having, e.g., Si—$CH_3$ bonds)), or a combination thereof. CESL 252 includes a dielectric material that is different than the dielectric material of ILD layer 254. For example, where ILD layer 254 includes silicon and oxygen (e.g., porous silicon oxide), CESL 252 can include silicon and nitrogen, such as silicon nitride, silicon carbonitride, or silicon oxycarbonitride.

In some embodiments, the device precursor is received before and/or after forming dielectric layer 250. Forming dielectric layer 250 can include depositing a dielectric material over substrate 202, isolation feature 222, epitaxial source/drains 225, and gate structure 230 and performing a planarization process, such as a chemical mechanical polishing (CMP), on the dielectric material. The planarization process removes any dielectric material from over gate structure 230. Dummy gate 232 can function as a planarization stop layer, and the planarization process can be performed until reaching dummy gate 232. The planarization process can planarize a top surface of dielectric layer 250 and a top surface of gate structure 230. In some embodiments, dielectric layer 250 is a device-level dielectric layer of a multilayer interconnect (MLI) feature, which electrically connects devices (for example, transistors, resistors, capacitors, inductors, etc.), components of devices (for example, gates and/or source/drains), devices within the MLI feature, components of the MLI feature, or a combination thereof, such that the devices and/or components can operate as specified by design requirements.

Figure 4B:
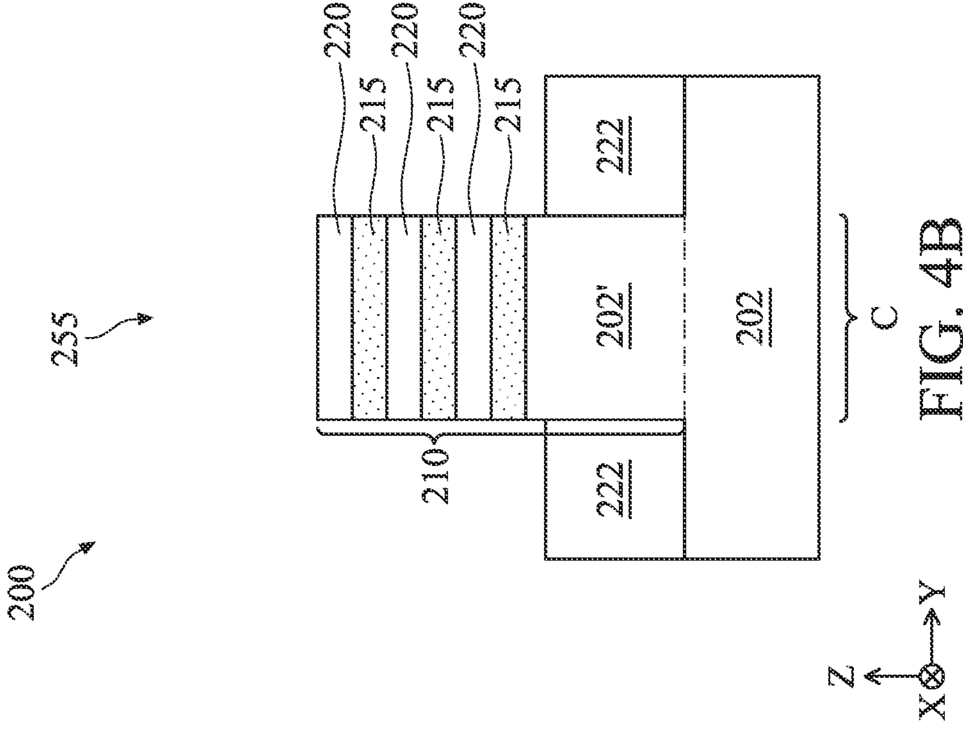
Figure 4A:
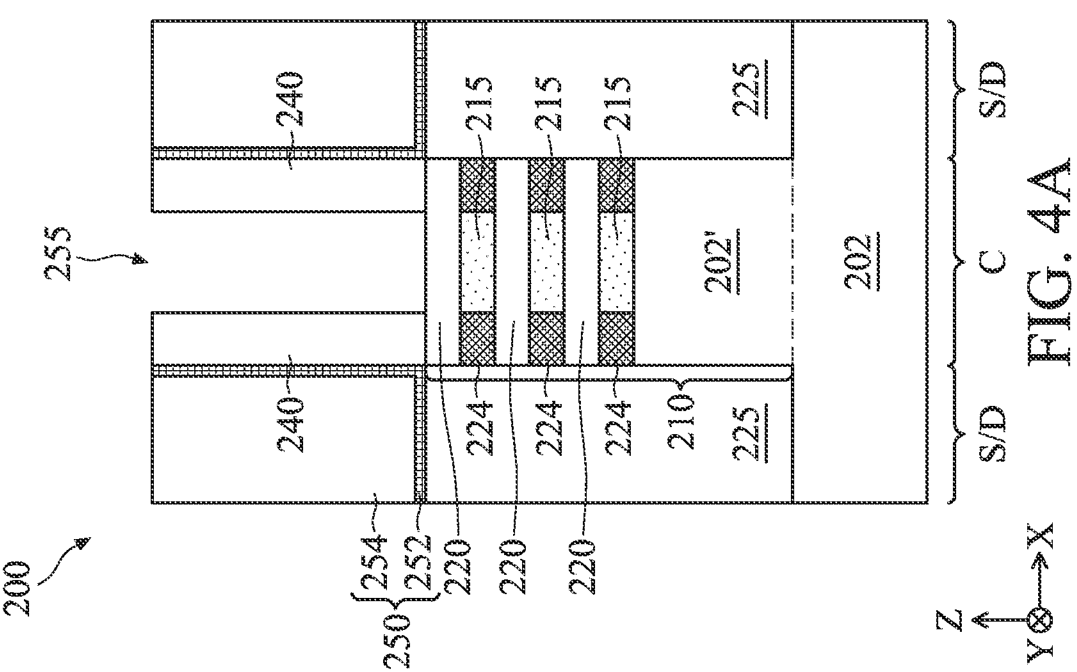

Turning to FIG. 1A. FIG. 4A, and FIG. 4B, method 100 at block 110 includes removing dummy gate 232 to form a gate opening 255 that exposes channel layer 210. Gate opening 255 has sidewalls formed by gate spacers 240 and a bottom formed by channel layer 210 and/or isolation feature 222. In some embodiments, an etching process selectively removes dummy gate 232 with respect to gate spacers 240, dielectric layer 250, or a combination thereof. For example, the etching process substantially removes dummy gate 232 but does not remove, or does not substantially remove, gate spacers 240, isolation feature 222, dielectric layer 250, etc. In some embodiments, an etchant is selected for the etching process that etches polysilicon (i.e., dummy gate 232) at a higher rate than dielectric materials (i.e., gate spacers 240, dielectric layer 250, etc.) (i.e., the etchant has a high etch selectivity with respect to polysilicon). The etching process is a dry etch, a wet etch, other suitable etch, or a combination thereof. In some embodiments, a patterned mask layer (an etch mask) covers and protects dielectric layer 250 and/or gate spacers 240 but exposes dummy gate 232 during the etching process.

Figure 5B:
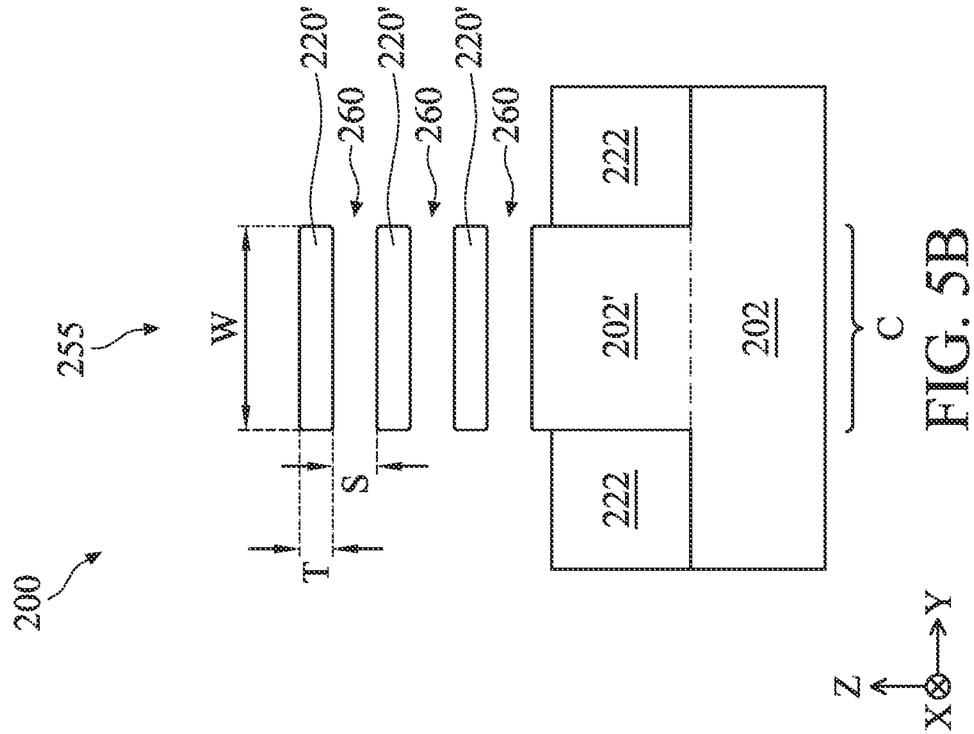
Figure 5A:
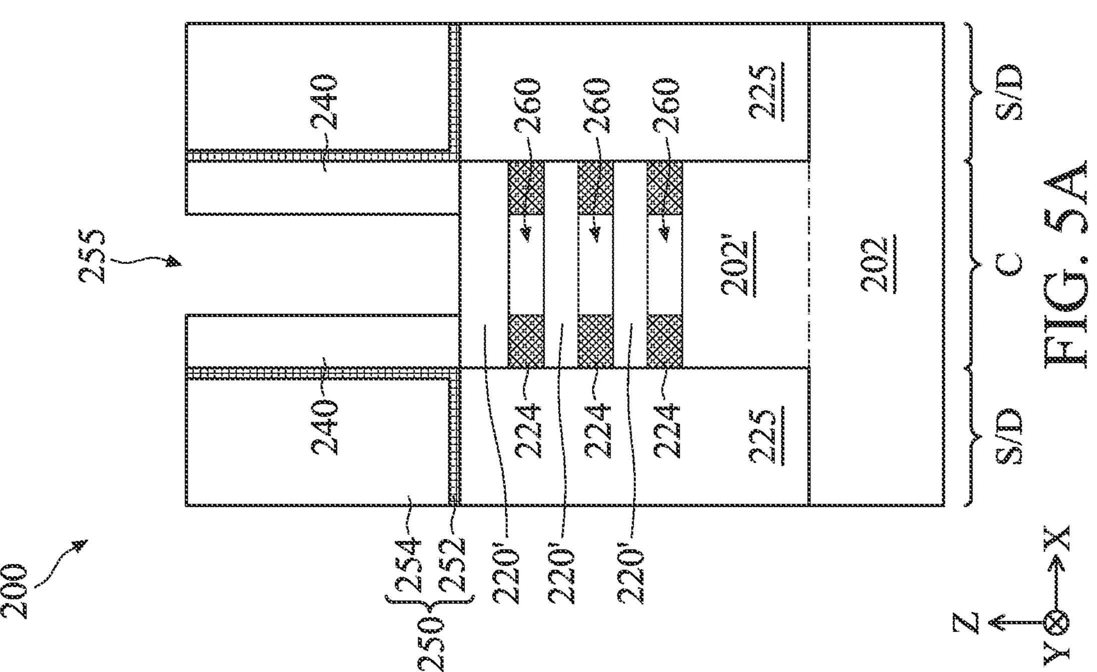

Turning to FIG. 1A, FIG. 5A, and FIG. 5B, method 100 at block 115 can include performing a channel release process. For example, semiconductor layers 215 exposed by gate opening 255 are selectively removed to form air gaps 260 between semiconductor layers 220 and between semiconductor layers 220 and mesa 202', thereby suspending semiconductor layers 220 in channel region C. In the depicted embodiment, three suspended semiconductor layers 220 are vertically stacked along the z-direction and provide three channels through which current can flow between epitaxial source/drains 225. Suspended semiconductor layers 220 are thus referred to hereafter as channel layers 220'. Channel layers 220' have a width W along the y-direction, a thickness T along the z-direction, and a spacing S1 along the z-direction. In some embodiments, width W is about 10 nm to about 60 nm. In some embodiments, thickness T is about 5 nm to about 10 nm. In some embodiments, spacing S is about 5 nm to about 15 nm.

In some embodiments, the channel release process includes an etching process that selectively etches semiconductor layers 215 with minimal to no etching of semiconductor layers 220, mesa 202', gate spacers 240, inner spacers 224, isolation feature 222, dielectric layer 250, or a combination thereof. In some embodiments, an etchant is selected for the etch process that etches silicon germanium (i.e., semiconductor layers 215) at a higher rate than silicon (i.e., semiconductor layers 220) and dielectric materials (i.e., gate spacers 240, inner spacers 224, isolation feature 222, dielectric layer 250, etc.) (i.e., the etchant has a high etch selectivity with respect to silicon germanium). The etching process is a dry etch, a wet etch, other suitable etching process, or a combination thereof. In some embodiments, before performing the etching process, an oxidation process converts semiconductor layers 215 into semiconductor oxide features (e.g., silicon germanium oxide), and the etching process then removes the semiconductor oxide features. In some embodiments, during and/or after removing semiconductor layers 215, an etching process is performed to modify a profile of semiconductor layers 220 to achieve target dimensions and/or target shapes for channel layers 220', such as cylindrical-shaped channel layers (e.g., nanowires), rectangular-shaped channel layers (e.g., nanobars), sheet-shaped channel layers (e.g., nanosheets), etc.

Turning to FIG. 1, FIGS. 6A-17A, and FIGS. 6B-17B, method 100 at block 120 includes forming a gate stack in gate opening 255. The gate stack includes a gate dielectric 230A (e.g., at least one dielectric gate layer) and a gate electrode 230B (e.g., at least one electrically conductive gate layer, such as a work function layer and/or a bulk/fill metal layer). The gate stack fills gate opening 255 and, in the depicted embodiment, air gaps 260 (see FIG. 17A and FIG. 17B). For example, the gate stack is disposed between channel layers 220' and between channel layers 220' and mesa 202'. In the X-Z plane (FIG. 17A), the gate stack is disposed between gate spacers 240 and between inner spacers 224. In the Y-Z plane (FIG. 17B), the gate stack at least partially surrounds (e.g., encircles) channel layers 220'. The gate stack may include more or less layers than depicted and described herein. The gate stack and gate spacers 240 are collectively referred to as gate structure 230.

Figure 6B:
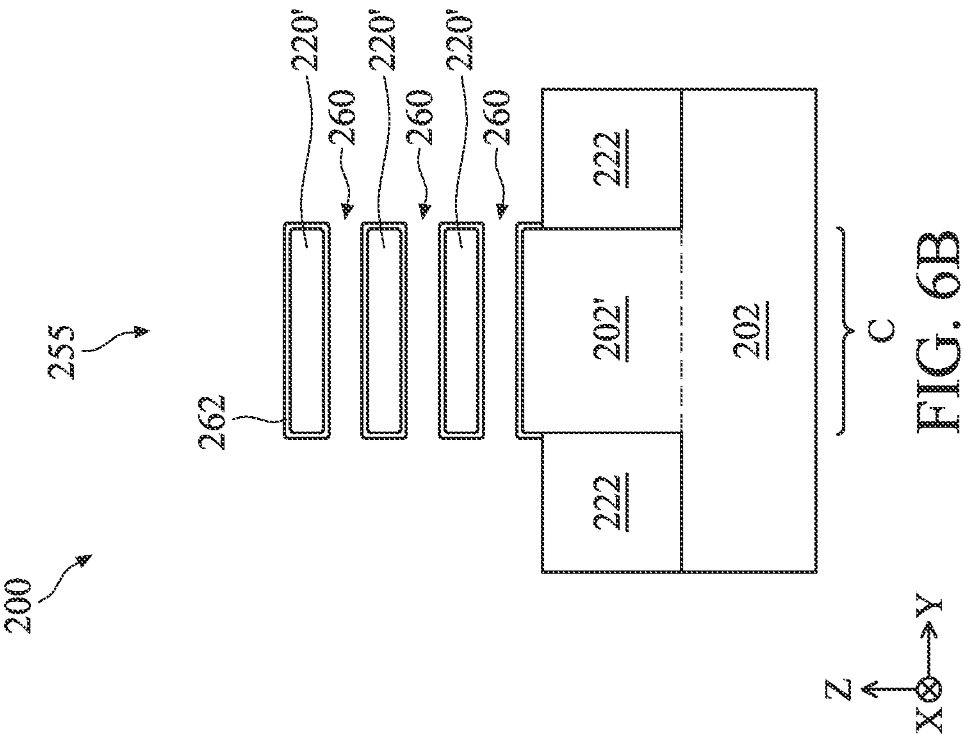
Figure 6A:
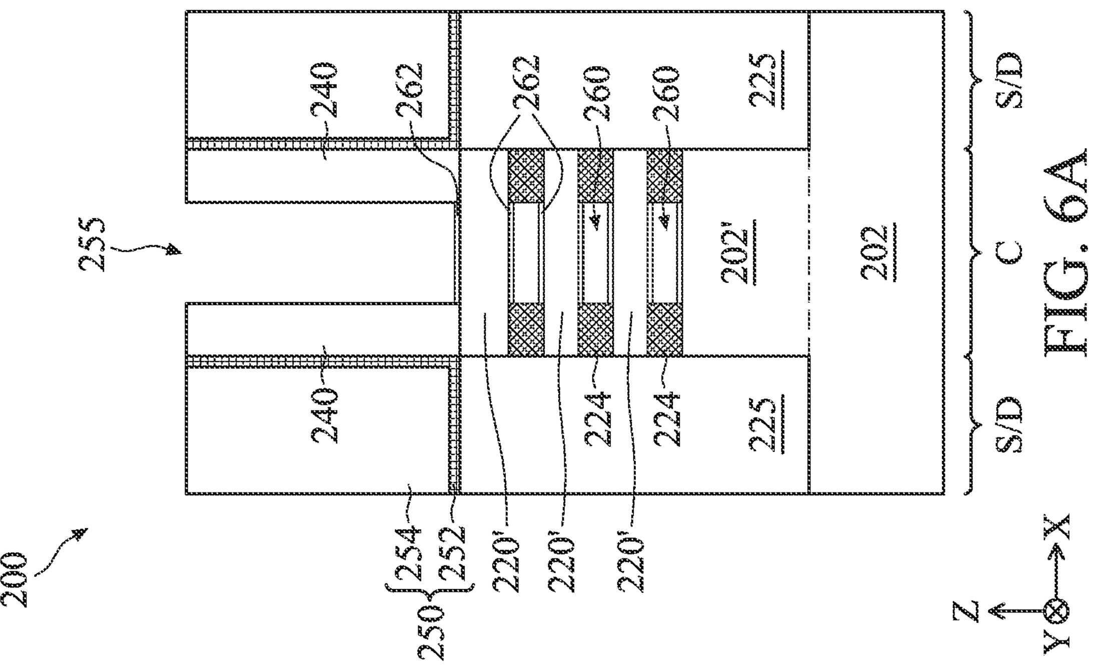

Referring to FIG. 1A, FIG. 6A, and FIG. 6B, method 100 at block 125 includes forming an interfacial layer 262 in gate opening 255 and over channel layers 220'. Interfacial layer 262 includes a dielectric material, such as $SiO_2$, $SiGeO_x$, HfSiO, SiON, other dielectric material, or a combination thereof. Interfacial layer 262 partially fills gate opening 255 (including air gaps 260). In the depicted embodiment, interfacial layer 262 is formed on semiconductor surfaces (e.g., channel layers 220' and mesa 202') but not dielectric surfaces (e.g., inner spacers 224, isolation feature 222, gate spacers 240, and dielectric layer 250). For example, interfacial layer 262 is formed by an oxidation process, such as thermal oxidation and/or chemical oxidation, where oxygen reacts with semiconductor surfaces to form a semiconductor oxide (i.e., interfacial layer 262) but not dielectric surfaces. In the X-Z plane, interfacial layer 262 covers top surfaces of channel layers 220', bottom surfaces of channel layers 220', and a top surface of mesa 202'. In the Y-Z plane, interfacial layer 262 surrounds channel layers 220' and wraps mesa 202'. In some embodiments, interfacial layer 262 is formed over channel layers 220, mesa 202', isolation feature 222, inner spacers 224, gate spacers 240, and dielectric layer 250 by, for example, atomic layer deposition (ALD) and/or other suitable method. In some embodiments, interfacial layer 262 has a substantially uniform thickness. In some embodiments, interfacial layer 262 has a thickness of about 5 Å to about 50 Å.

Figure 7B:
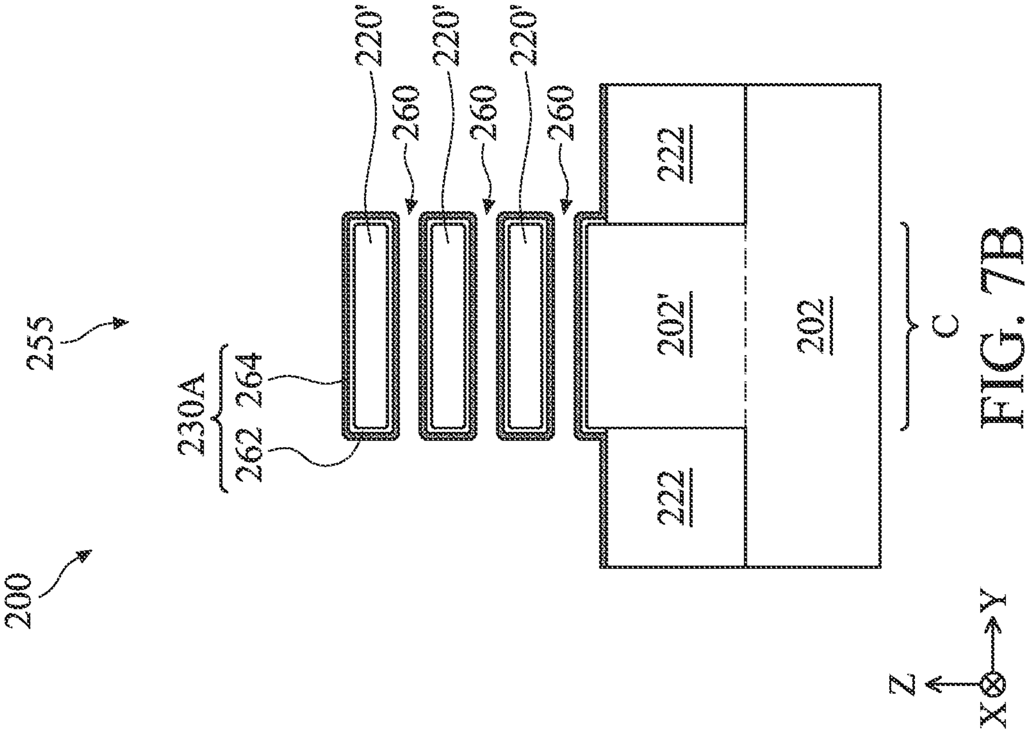
Figure 7A:
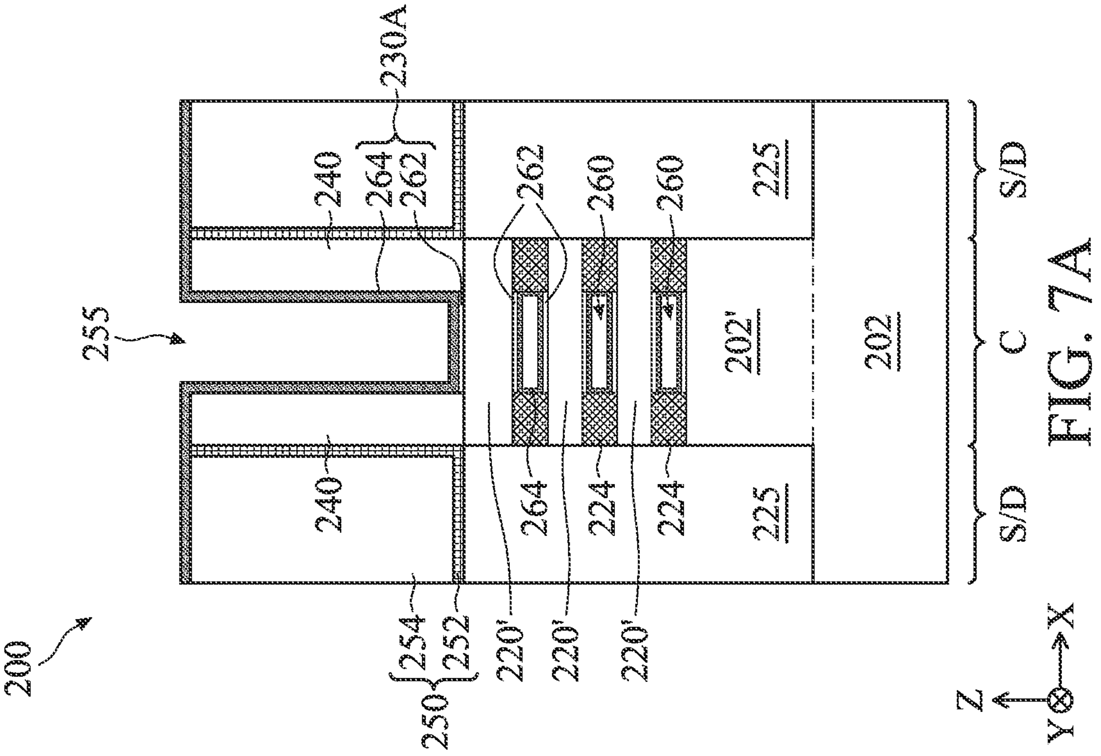

Referring to FIG. 1A, FIG. 7A, and FIG. 7B, method 100 at block 130 includes forming a high-k dielectric layer 264 over interfacial layer 262. High-k dielectric layer 264 includes a high-k dielectric material, such as $HfO_2$, HfSiO, $HfSiO_4$, HfSiON, HfLaO, HfTaO, HfTiO, HfZrO, HfAlOx, ZrO, $ZrO_2$, $ZrSiO_2$, TiO, $TiO_2$, $HfO_2$—$Al_2O_3$, other high-k dielectric material, or a combination thereof. High-k dielectric material generally refers to a dielectric material having a dielectric constant that is greater than a dielectric constant of silicon dioxide (k≈3.9). For example, high-k dielectric layer 264 is a hafnium-based oxide (e.g., $HfO_2$) layer or a zirconium-based oxide (e.g., $ZrO_2$) layer. High-k dielectric layer 264 partially fills gate opening 255 (including air gaps 260) and is formed on interfacial layer 262, gate spacers 240, inner spacers 224, isolation feature 222, and dielectric layer 250. In the X-Z plane, high-k dielectric layer 264 has a u-shaped profile in a top portion of gate opening 255 and rectangular-shaped profiles in a bottom portion of gate opening 255 (i.e., in air gaps 260). In the Y-Z plane, high-k dielectric layer 264 surrounds channel layers 220' and wraps mesa 202'. A thickness of high-k dielectric layer 264 is greater than a thickness of interfacial layer 262. In some embodiments, high-k dielectric layer 264 has a substantially uniform thickness. In some embodiments, a thickness of high-k dielectric layer 264 is about 10 Å to about 50 Å. In some embodiments, a thickness of high-k dielectric layer 264 is about 10 Å to about 20 Å. High-k dielectric layer 264 is formed by ALD, chemical vapor deposition (CVD), physical vapor deposition (PVD), plasma enhanced ALD (PEALD), plasma enhanced CVD (PECVD), remote plasma CVD (RPCVD), low-pressure CVD (LPCVD), atomic layer CVD (ALCVD), atmospheric pressure CVD (APCVD), high density plasma CVD (HDPCVD), metal organic CVD (MOCVD), an oxide-based deposition process, other suitable process, or a combination thereof.

Figure 8B:
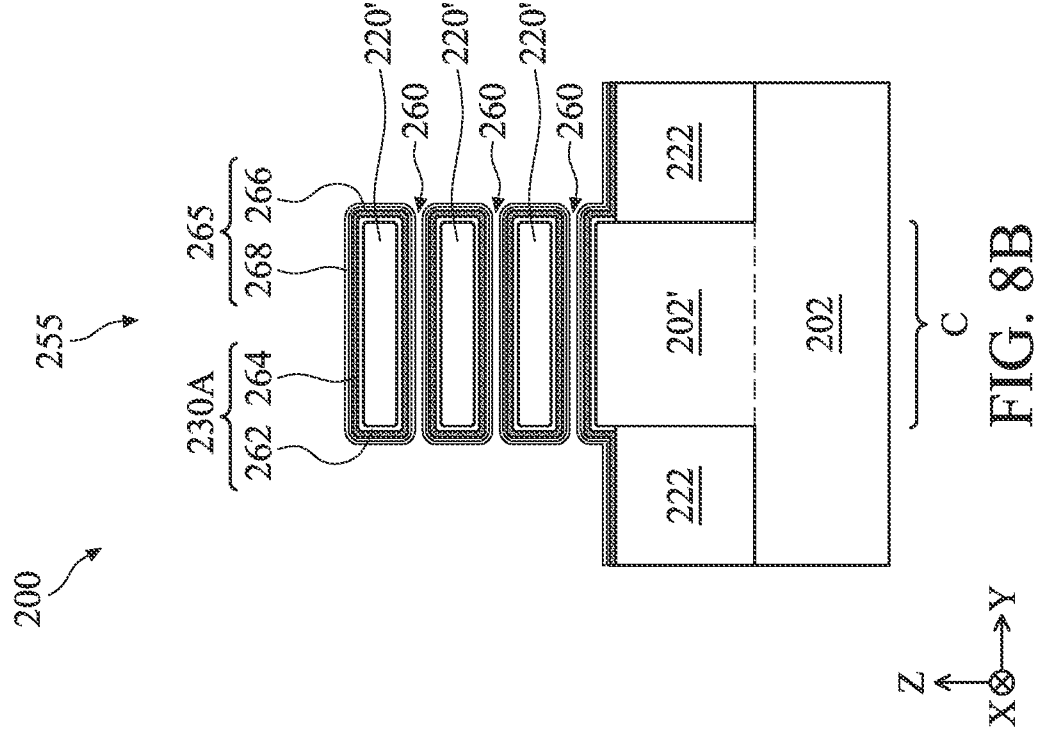
Figure 8A:
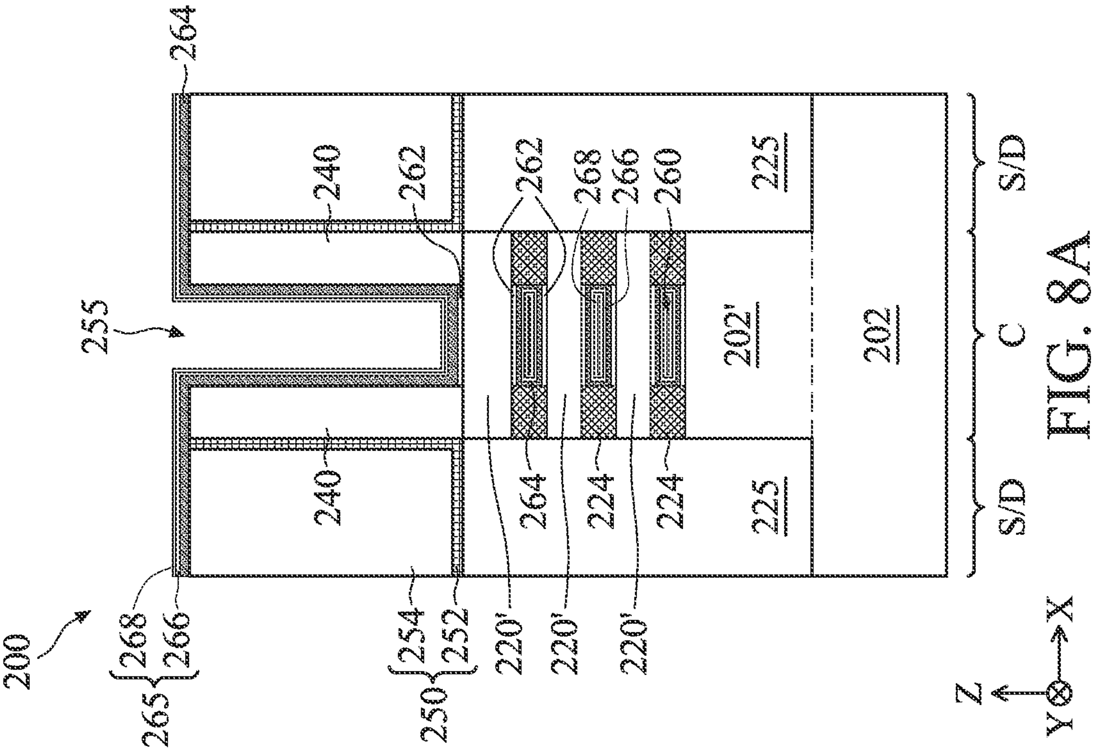
Figure 9B:
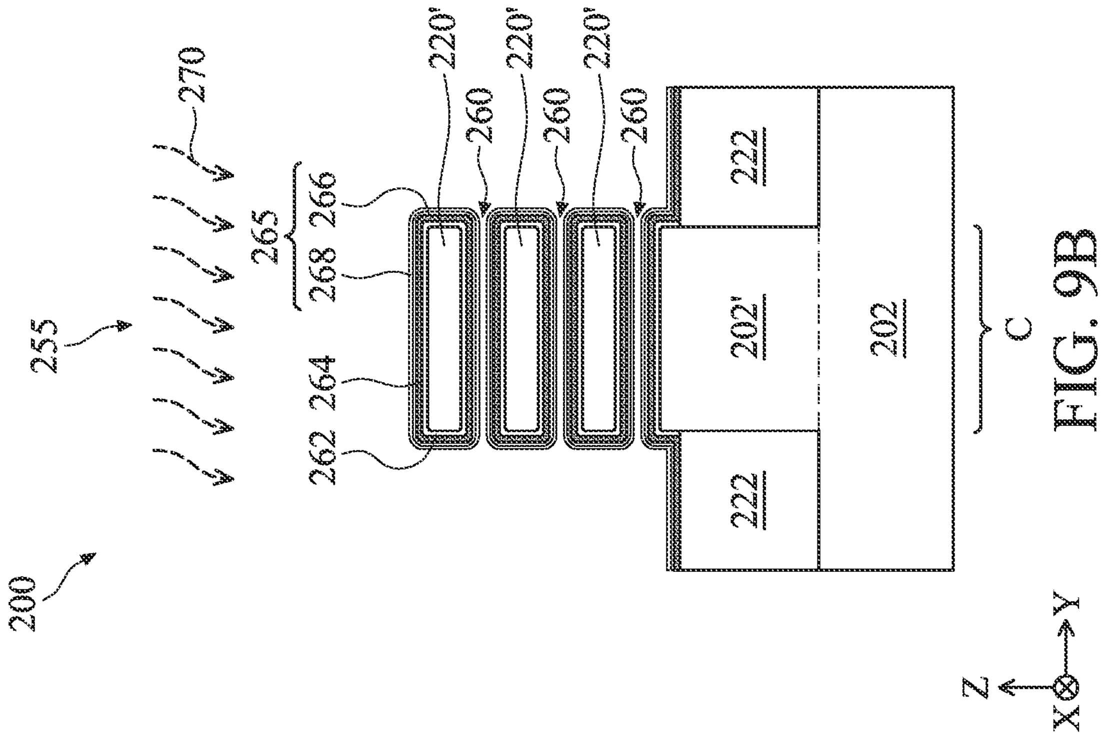
Figure 9A:
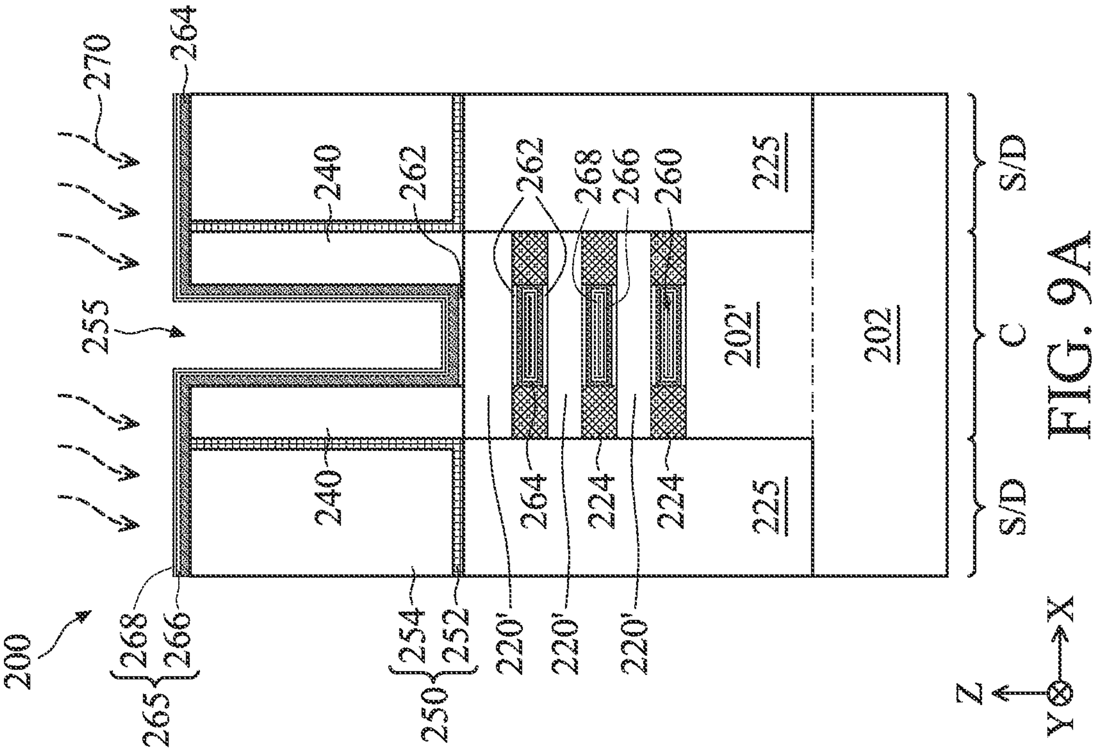
Figure 10B:
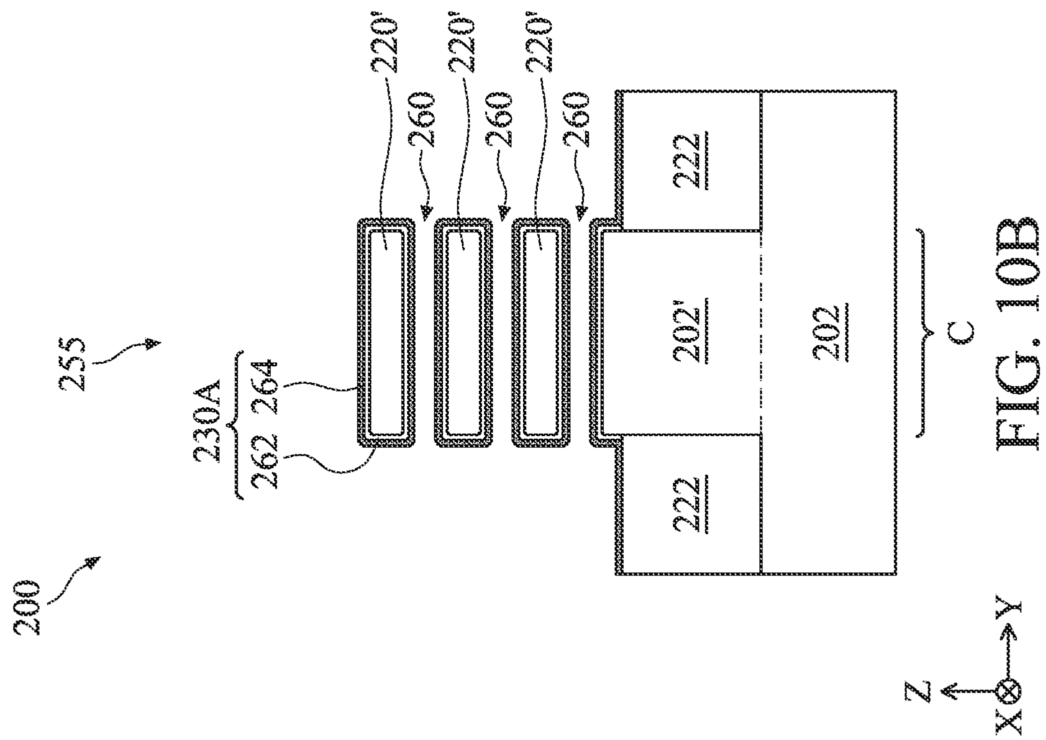
Figure 10A:
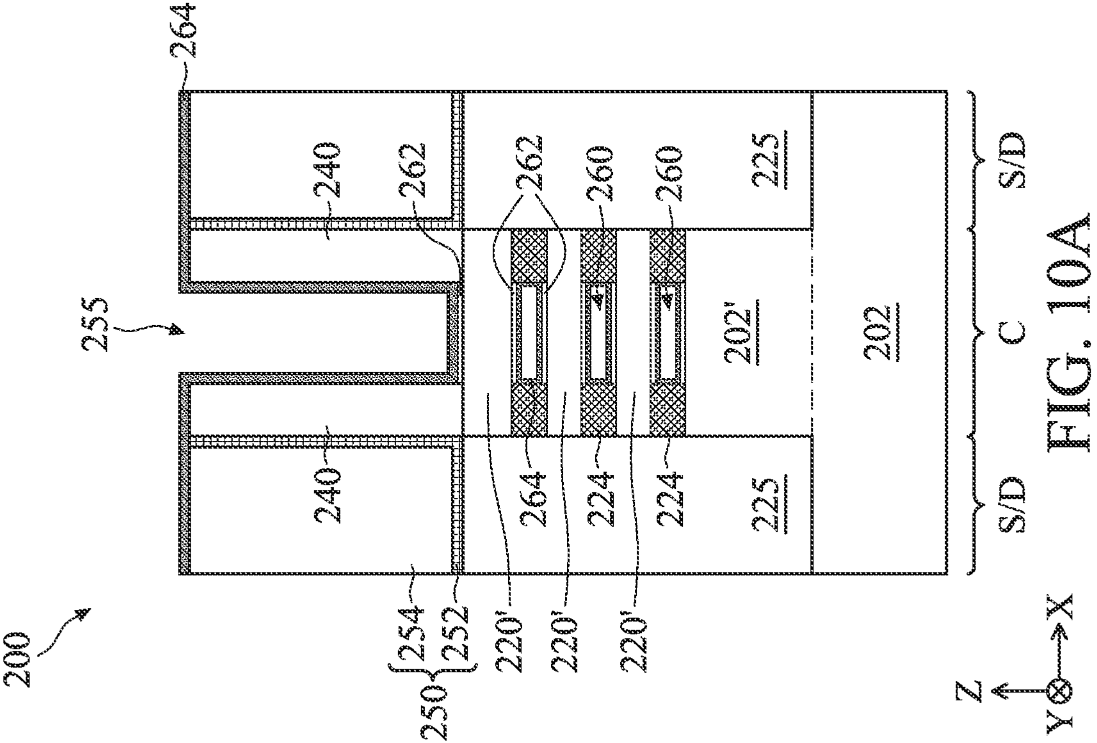

Referring to FIG. 1A, FIGS. 8A-10A, and FIGS. 8B-10B, a treatment process can be performed to improve a quality of gate dielectric 230A (i.e., high-k dielectric layer 264 and/or interfacial layer 262). For example, method 100 can include forming a sacrificial cap 265 (including a sacrificial capping layer 266 and a sacrificial capping layer 268) over high-k dielectric layer 264 at block 135 (FIG. 8A and FIG. 8B), performing a thermal treatment 270 at block 140 (FIG. 9A and FIG. 9B), and removing sacrificial cap 265 at block 145 (FIG. 10A and FIG. 10B). In the depicted embodiment, sacrificial cap 265 has a multilayer structure, such as sacrificial capping layer 266 and sacrificial capping layer 268. In some embodiments, sacrificial cap 265 has more or less layers. Sacrificial cap 265 partially fills gate opening 255 (including air gaps 260) and is formed on high-k dielectric layer 264. Sacrificial cap 265 and processing associated therewith can be configured to improve a quality of gate dielectric 230A, such as by reducing/minimizing oxygen vacancies and/or other defects in interfacial layer 262 and/or high-k dielectric layer 264, reducing/inhibiting growth of interfacial layer 262 and/or high-k dielectric layer 264 (and thus undesired increases in equivalent oxide thickness and/or capacitance equivalent thickness of gate dielectric 230A), densifying and/or crystallizing interfacial layer 262 and/or high-k dielectric layer 264, removing impurities and/or constituents from interfacial layer 262 and/or high-k dielectric layer 264, improving an interface between interfacial layer 262 and high-k dielectric layer 264, improving an interface of gate dielectric 230A with channel layers 220', or a combination thereof. The treatment process may be repeated with different capping layers, different reactive environment, and at different temperatures. In some embodiments, the treatment process is omitted from fabrication of the gate stack of device 200.

In FIG. 8A and FIG. 8B, sacrificial cap 265 is formed by depositing sacrificial capping layer 266 over high-k dielectric layer 264 and depositing sacrificial capping layer 268 over sacrificial capping layer 266. A composition of sacrificial capping layer 266 is different than a composition of sacrificial capping layer 268. For example, sacrificial capping layer 266 is a metal-comprising layer and sacrificial capping layer 268 is a semiconductor-comprising layer. In the depicted embodiment, sacrificial capping layer 266 is a metal nitride layer, and sacrificial capping layer 268 is a silicon-comprising layer. The metal nitride layer can include titanium nitride (TiN), titanium silicon nitride (TiSiN), tantalum silicon nitride (TaSiN), tantalum nitride (TaN), tantalum carbide nitride (TaCN), other suitable metal nitride material, or a combination thereof. The silicon-comprising layer can be a silicon layer, a polysilicon layer, an amorphous silicon layer, or a combination thereof. Sacrificial capping layer 266 and sacrificial capping layer 268 are deposited by ALD, CVD, PVD, PEALD, PECVD, RPCVD, LPCVD, ALCVD, APCVD, HDPCVD, MOCVD, other process, or a combination thereof.

In FIG. 9A and FIG. 9B, thermal process 270 heats device 200, features thereof (e.g., sacrificial cap 265 and/or gate dielectric 230A), an ambient/environment containing device 200, or a combination thereof to a temperature that can improve quality of gate dielectric 230A. In some embodiments, thermal process 270 is an annealing process, such as a rapid thermal annealing (RTA), a millisecond annealing (MSA), a microsecond annealing (μSA), a microwave annealing, a laser annealing, a spike annealing, a soak annealing, a furnace annealing, other suitable annealing process, or a combination thereof. Thermal process 270 can include performing an annealing before depositing sacrificial cap 265 (e.g., a post-deposition anneal (PDA)), performing an annealing after depositing sacrificial capping layer 266 and before depositing sacrificial capping layer 268 (e.g., a post-metallization anneal (PMA)), performing an annealing after depositing sacrificial capping layer 268 (e.g., a post-cap anneal (PCA)), performing another annealing, or a combination thereof. In the depicted embodiment, thermal process 270 is performed after depositing sacrificial capping layer 268. In some embodiments, parameters of an annealing process, such as anneal temperature, anneal time, anneal ambient, pressure, etc.) are configured to reduce/minimize oxygen vacancies and/or other defects in gate dielectric 230A. In some embodiments, parameters of thermal process 270 are tuned to cause constituent (e.g., nitrogen) to diffuse from sacrificial cap 265 (e.g., sacrificial capping layer 266) and/or a thermal process environment (e.g., an annealing environment) into gate dielectric 230A (e.g., high-k dielectric layer 264 and/or interfacial layer 262). In some embodiments, parameters of thermal process 270 are tuned to cause constituent (e.g., oxygen) to diffuse from gate dielectric 230A into sacrificial cap 265 (e.g., sacrificial capping layer 268).

In FIG. 10A and FIG. 10B, sacrificial cap 265 is removed to expose high-k dielectric layer 264. In some embodiments, an etching process selectively removes sacrificial cap 265 with respect to high-k dielectric layer 264. For example, the etching process substantially removes sacrificial capping layer 266 and sacrificial capping layer 268 but does not remove, or does not substantially remove, high-k dielectric layer 264. In some embodiments, an etchant is selected for the etching process that etches sacrificial cap 265 (e.g., a metal nitride layer and/or a semiconductor layer, such as a silicon layer) at a higher rate than high-k dielectric layer 264 (e.g., an $HfO_2$ layer, a $ZrO_2$ layer, other high-k dielectric material, or a combination thereof). The etching process is a dry etch, a wet etch, other suitable etch, or a combination thereof. In some embodiments, the etching process is a multistep process, such as a first etch to remove sacrificial capping layer 268 and a second etch to remove sacrificial capping layer 266. In some embodiments, the etching process uses different etchants to separately remove sacrificial capping layer 266 and sacrificial capping layer 268. In some embodiments, the etching process uses the same etchant to remove sacrificial capping layer 266 and sacrificial capping layer 268.

Figure 11B:
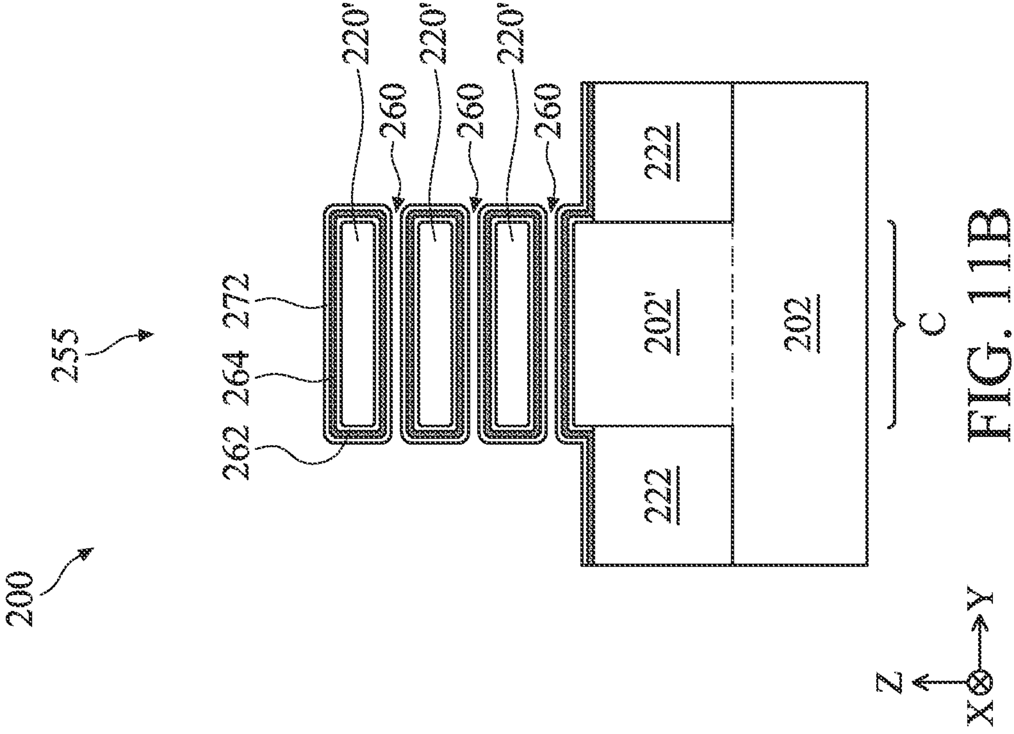
Figure 11A:
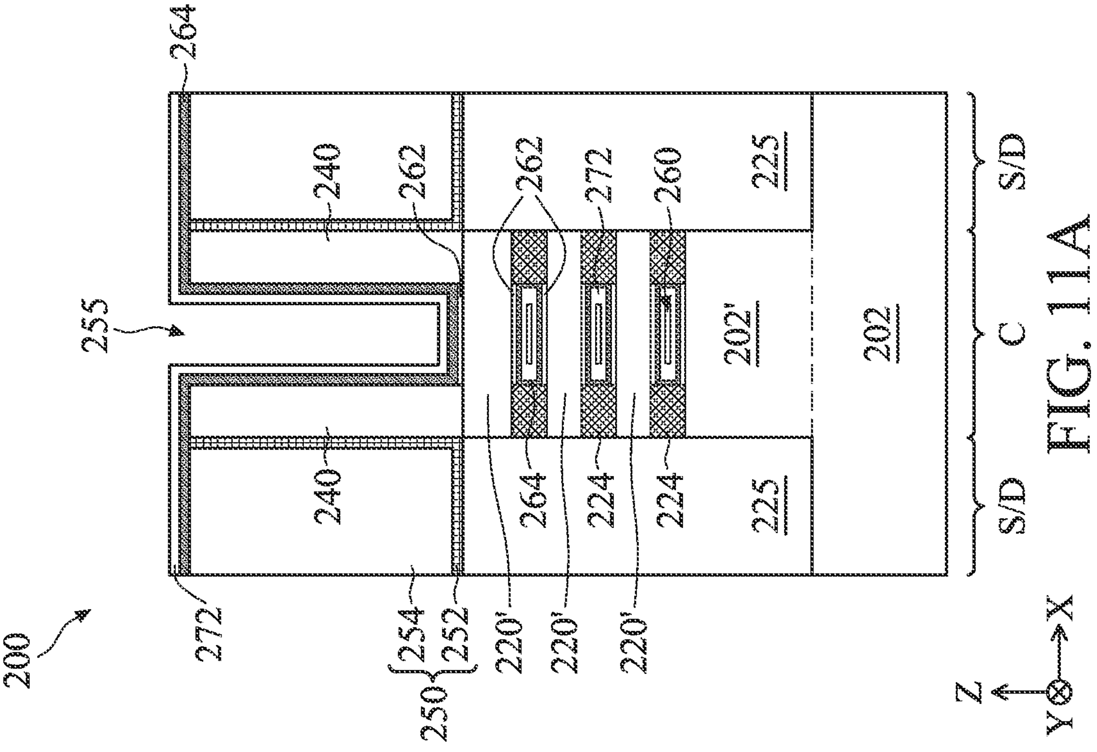

Referring to FIG. 1A, FIG. 11A, and FIG. 11B, method 100 at block 150 includes forming a work function layer 272 over high-k dielectric layer 264. Work function layer 272 partially fills gate opening 255 (including air gaps 260). In the X-Z plane, work function layer 272 has a u-shaped profile in a top portion of gate opening 255 and rectangular-shaped profiles in a bottom portion of gate opening 255 (i.e., in air gaps 260). In the Y-Z plane, work function layer 272 surrounds channel layers 220' and wraps mesa 202'. A thickness of work function layer 272 is greater than a thickness of high-k dielectric layer 264. In some embodiments, work function layer 272 has a substantially uniform thickness, such as depicted. In some embodiments, a thickness of work function layer 272 is about 10 Å to about 40 Å. Work function layer 272 is formed by ALD, CVD, PVD, other process, or a combination thereof.

Work function layer 272 is an electrically conductive layer tuned to have a desired work function, such as an n-type work function or a p-type work function. Work function layer 272 includes work function metal(s) and/or alloys thereof, such as Ti, Ta, Al, Ag, Mn, Zr, W, Ru, Mo, TiC, TiAl, TiAlC, TiAlSiC, TaC, TaCN, TaSiN, TiSiN, TiN, TaN, TaSN, WN, WCN, $ZrSi_2$, $MoSi_2$, $TaSi_2$, $NiSi_2$, TaAl, TaAlC, TaSiAlC, TiAlN, or a combination thereof. In some embodiments, work function layer 272 is an n-type work function layer that includes n-type work function metal(s), such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function metal and/or alloys thereof, or a combination thereof. In the depicted embodiment, work function layer 272 is an n-type work function layer, such as a TiAlC layer. In some embodiments, the TiAlC layer is formed by an ALD or a CVD that implements a titanium-containing precursor (e.g., $TiCl_4$) and an aluminum-containing precursor (e.g., trimethylaluminum (TMA)) and a temperature of about 300° C. to about 400° C. In some embodiments, parameters of the ALD and/or other deposition process (e.g., CVD) are tuned to provide the TiAlC layer with about 30 atomic percent (at %) Al to about 40 at % Al. In some embodiments, work function layer 272 is a p-type work function layer that includes p-type work function metal(s), such as TiN, TaN, TaSN, Ru, Mo, Al, WN, WCN, $ZrSi_2$, $MoSi_2$, $TaSi_2$, $NiSi_2$, other p-type work function metal and/or alloys thereof, or a combination thereof. In some embodiments, work function layer 272 is tuned to have an n-type work function or a p-type work function depending on a type of transistor to which it belongs. For example, when device 200 is configured as an n-type transistor, work function layer 272 can include an n-type work function material, and when device 200 is configured as a p-type transistor, work function layer 272 can include a p-type work function material.

Figure 13B:
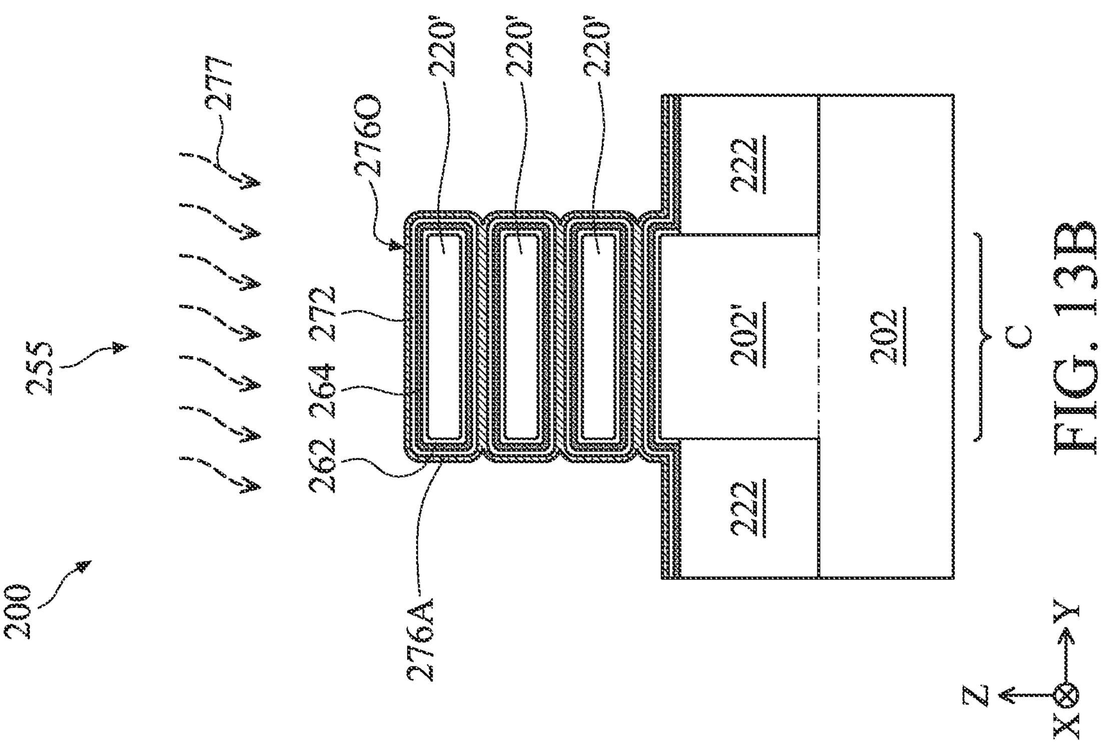
Figure 13A:
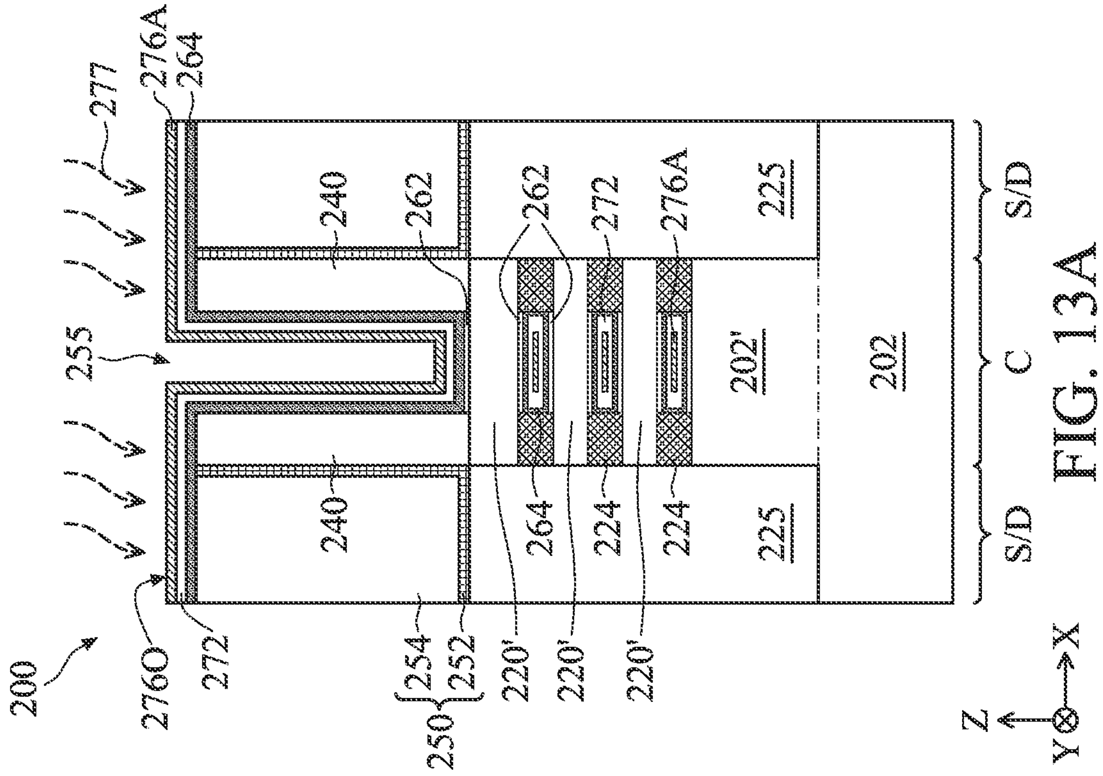
Figures 14A, 14B:
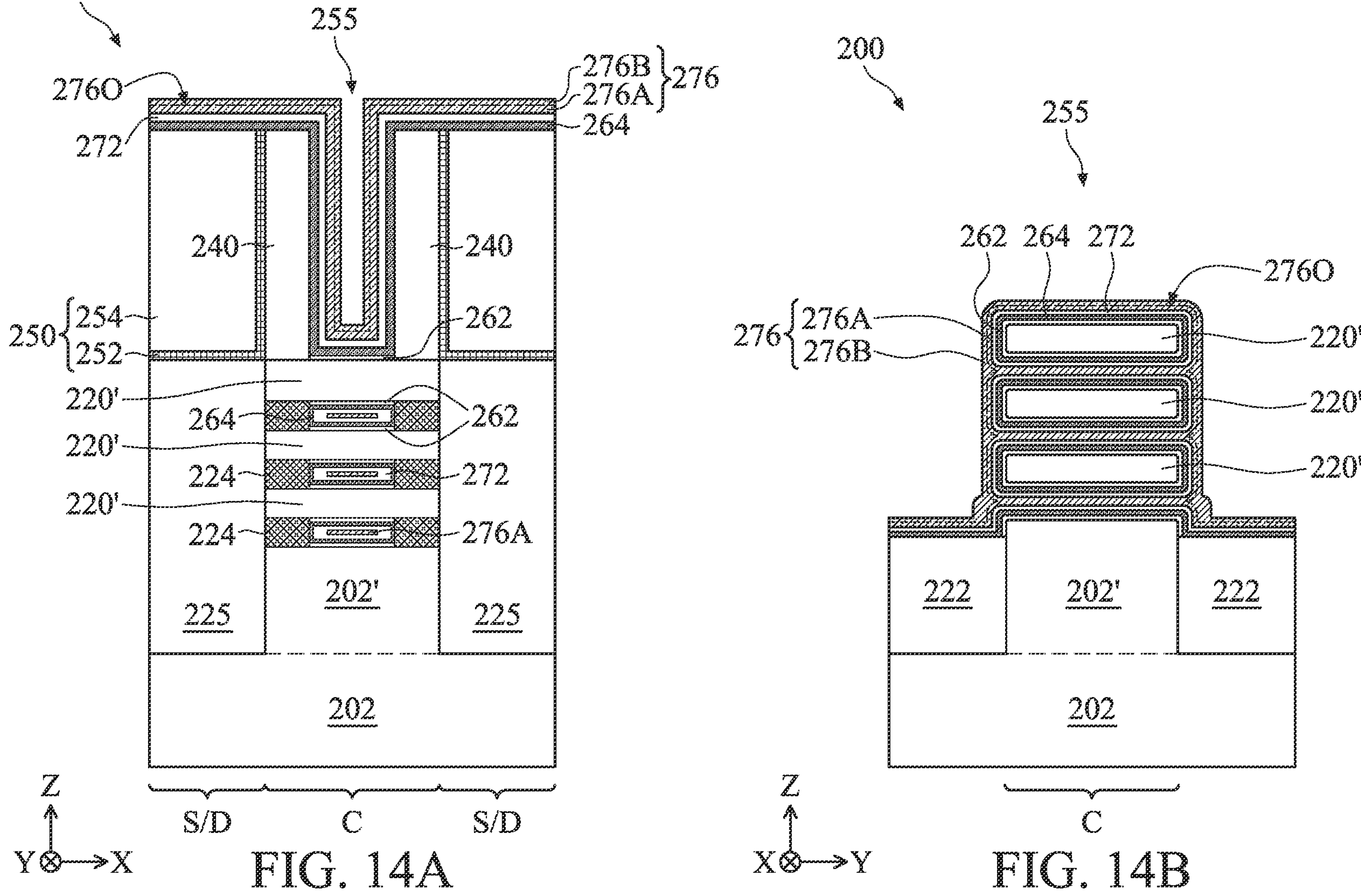
Figures 15A, 15B:
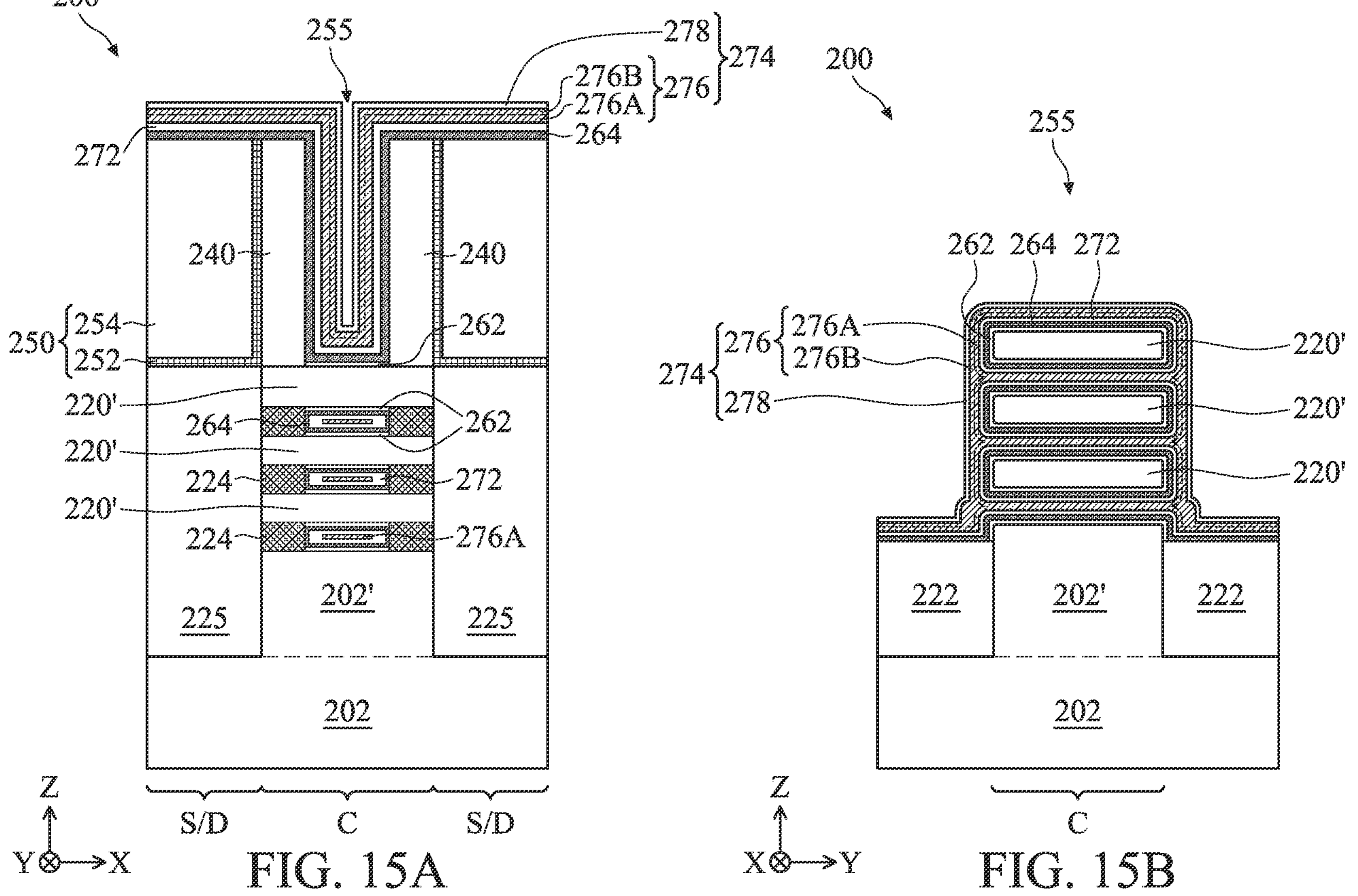

Referring to FIG. 1A, FIG. 1B, FIGS. 12A-15A, and FIGS. 12B-15B, method 100 at block 155 includes forming a cap 274 over work function layer 272. Cap 274 includes a capping layer 276 and a capping layer 278. A composition of capping layer 276 is different than a composition of capping layer 278. For example, capping layer 276 is a metal-comprising layer (e.g., a metal nitride layer), and capping layer 278 is a semiconductor-comprising layer (e.g., a silicon layer). Referring to FIG. 1B, forming cap 274 at block 155 of method 100 can include forming a first portion of capping layer 276 (e.g., a capping sublayer 276A thereof) over work function layer 272 at block 160 (FIG. 1B, FIG. 12A, and FIG. 12B), performing an oxygen control treatment 277 at block 165 (FIG. 1B, FIG. 13A, and FIG. 13B), forming a second portion of capping layer 276 (e.g., a capping sublayer 276B thereof) at block 170 (FIG. 1B, FIG. 14A, and FIG. 14B), and forming capping layer 278 over capping layer 276 at block 175 (FIG. 1B, FIG. 15A, and FIG. 15B). In the depicted embodiment, since capping layer 276 is a metal nitride layer, capping sublayer 276A and capping sublayer 276B are metal nitride sublayers. In some embodiments, capping sublayer 276A has more than two sublayers, where an oxygen control treatment may be performed after forming each sublayer or an oxygen control treatment may be performed after forming some sublayers.

In some embodiments, capping layer 278 has a multilayer structure. In some embodiments, cap 274 has more two capping layers.

Figure 12B:
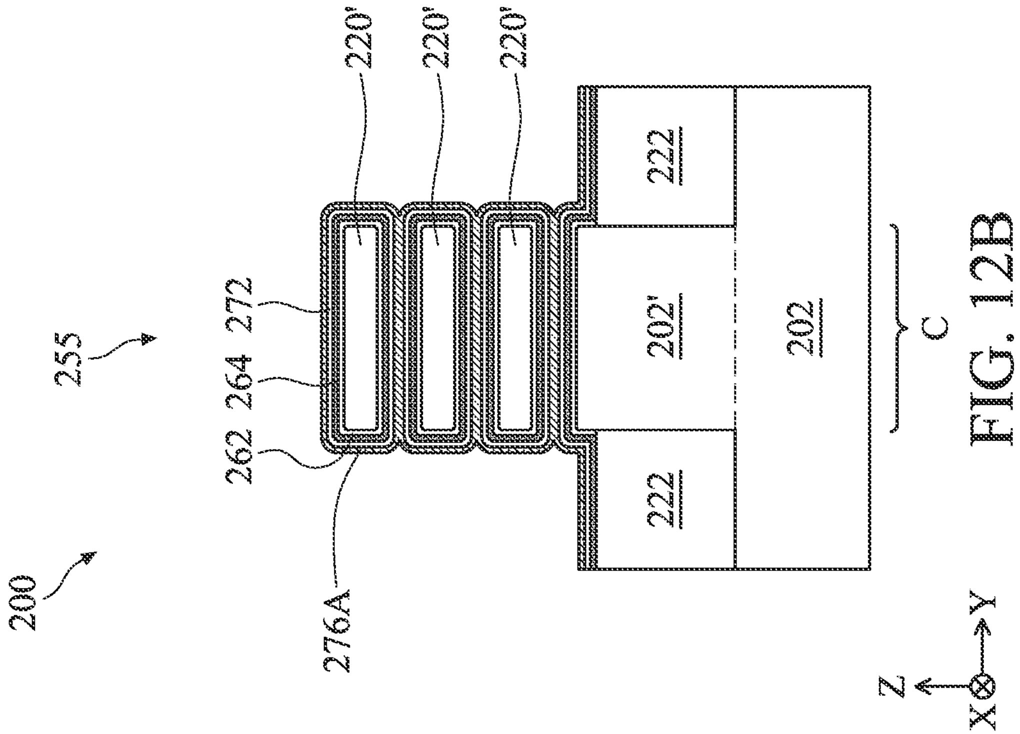
Figure 12A:
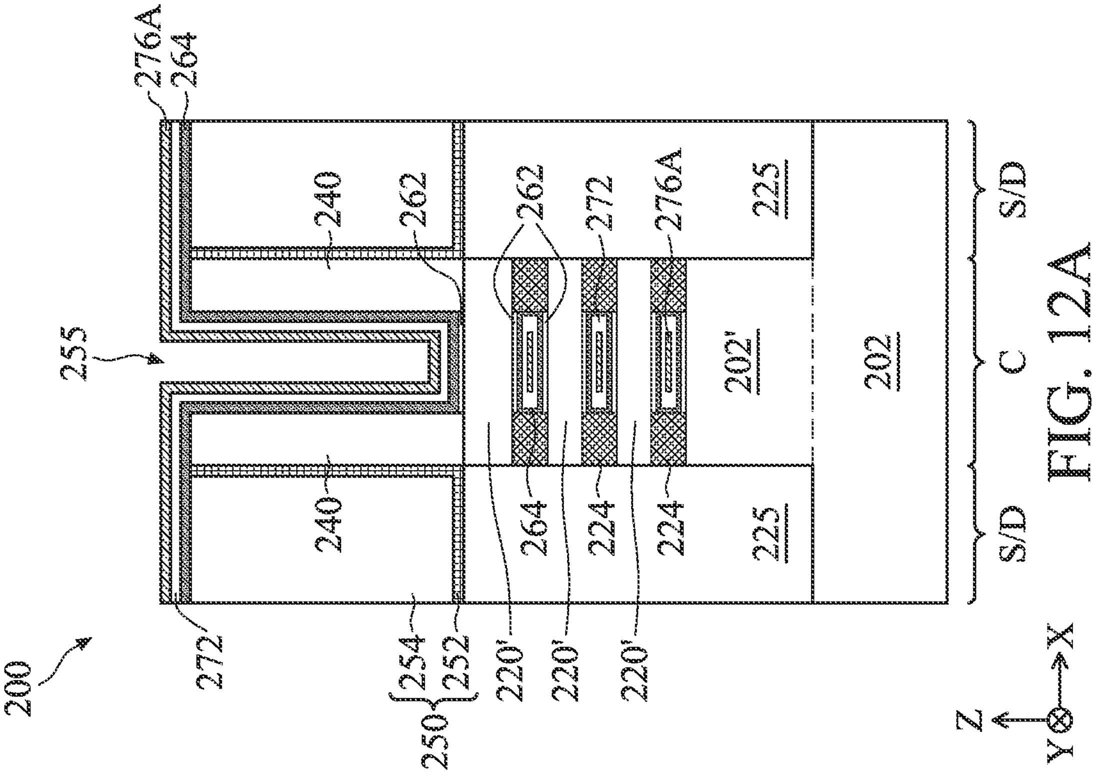

In FIG. 12A and FIG. 12B, capping sublayer 276A is formed over work function layer 272. Capping sublayer 276A partially fills the top portion of gate opening 255 and fills remainders of the bottom portion of gate opening 255 (i.e., air gaps 260). Accordingly, gaps between channel layers 220' and between bottommost channel layer 220' and mesa 202' are filled by capping sublayer 276A, work function layer 272, and gate dielectric 230A. In the X-Z plane, capping sublayer 276A has a u-shaped profile in the top portion of gate opening 255 and rectangular-shaped profiles in the bottom portion of gate opening 255. In the Y-Z plane, capping sublayer 276A surrounds channel layers 220' and wraps mesa 202'.

Capping sublayer 276A is a metal-comprising layer, such as a metal nitride layer. The metal nitride layer can include TiN, TiSiN, TaSiN, TaN, TaCN, WN, WCN, other metal nitride material, or a combination thereof. Capping sublayer 276A is formed by ALD, CVD. PVD, other process, or a combination thereof. In the depicted embodiment, capping sublayer 276A is a TiN sublayer. In some embodiments, capping sublayer 276A is formed by an ALD that implements a titanium-containing precursor (e.g., $TiCl_4$) and a nitrogen-containing precursor (e.g., ammonia ($NH_3$)) to form a TiN sublayer. Parameters of the ALD (e.g., a number of ALD cycles, ALD cycle time, temperature, pressure, etc.) and/or other deposition process can be tuned to obtain a desired thickness of capping sublayer 276A. In some embodiments, a thickness of capping sublayer 276A (e.g., the TiN sublayer) is about 10 Å to about 15 Å.

Capping sublayer 276A and work function layer 272 can be formed "in-situ," which generally refers to performing processes without breaking vacuum. For example, device 200 is contained in a vacuum-conditioned environment when forming work function layer 272 and capping sublayer 276A and remains under vacuum conditions between forming work function layer 272 and forming capping sublayer 276A. In other words, vacuum is not broken between forming work function layer 272 and forming capping sublayer 276A, such that device 200 is not exposed to air (e.g., atmospheric oxygen) between process steps. In some embodiments, work function layer 272 and capping sublayer 276A are formed in a same process chamber and device 200 remains under vacuum conditions between forming work function layer 272 and forming capping sublayer 276A. In some embodiments, work function layer 272 and capping sublayer 276A are formed in different process chambers of an IC process tool and/or an IC process system and device 200 remains under vacuum conditions when transferred from a process chamber for forming work function layer 272 to a process chamber for forming capping sublayer 276A. In some embodiments, work function layer 272 and capping sublayer 276A are formed in different IC process tools and/or IC process systems and device 200 remains under vacuum conditions when moved between the IC process tools and/or IC process systems.

In FIG. 13A and FIG. 13B, oxygen control treatment 277 exposes capping sublayer 276A to an oxygen ambient by breaking vacuum. For example, vacuum is broken (i.e., device 200 is no longer in a vacuum-conditioned environment) to expose capping sublayer 276A to air (e.g., atmospheric oxygen). Capping sublayer 276A adsorbs oxygen from the oxygen ambient, which can bond with metal and thus provide capping sublayer 276A with metal-oxygen bonds. Further, as capping sublayer 276A adsorbs oxygen, an exposed surface of capping sublayer 276A may be converted to a thin metal oxide layer and/or a thin metal oxynitride layer, which is depicted as oxidized surface 2760 that can include metal-oxygen bonds, metal-nitrogen bonds, metal-oxygen-nitrogen bonds, or a combination thereof. In some embodiments, a thickness of the oxidized layer of capping sublayer 276A is about 0.1 nm to about 0.2 nm. In embodiments where capping sublayer 276A includes metal-oxygen bonds before oxygen control treatment 277, such as where capping sublayer 276A includes oxygen and/or where oxygen has diffused into capping sublayer 276A during fabrication of device 200, metal-oxygen bonds of capping sublayer 276A increase as capping sublayer 276A adsorbs oxygen from the oxygen ambient. Forming and/or increasing metal-oxygen bonds in capping sublayer 276A reduces oxygen vacancies therein, which can mitigate oxygen diffusion from cap 274 and/or subsequently formed layers into work function layer 272 and gate dielectric 230A during fabrication of device 200, thereby reducing unintended oxidation and minimizing threshold voltage variations and/or other device performance changes (e.g., reductions in speed and/or mobility) caused by such oxidation. In the depicted embodiment, where capping sublayer 276A is a TiN sublayer, the TiN sublayer adsorbs oxygen from the oxygen ambient, which forms and/or increases Ti—O bonds of the TiN sublayer. In such embodiments, oxidized surface 2760 and/or capping sublayer 276A can include Ti—N bonds, Ti—O bonds, Ti—O—N bonds, or a combination thereof.

A duration (i.e., a time between depositing capping sublayer 276A and depositing capping sublayer 276B (referred to hereafter as a Q-time)) and/or other parameters (e.g., temperature, ambient, pressure, etc.) of oxygen control treatment 277 are configured to reduce oxygen vacancies in capping layer 276 sufficiently to mitigate oxygen diffusion from cap 274 and/or subsequently formed layers into work function layer 272 and/or gate dielectric 230A during subsequent fabrication of device 200. In some embodiments, a Q-time of oxygen control treatment 277 is about 3 hours to about 10 hours. Q-times less than about 3 hours may not sufficiently decrease oxygen vacancies in capping sublayer 276A, such that oxygen may still undesirably diffuse from capping sublayer 276 into other gate stack layers, while Q-times greater than about 10 hours may prohibitively increase cycle time required to fabricate device 200 and/or cause undesirable increases in oxygen in work function layer 272 and/or gate dielectric 230A. In some embodiments, parameters of oxygen control treatment 277, such as the Q-time, are tuned to provide oxidized surface 2760 with an x-ray photoelectron spectroscopy (XPS) atomic percentage of oxygen that is at least 20%, such as about 20% to about 60%.

In some embodiments, instead of exposing breaking vacuum, oxygen control treatment 277 can expose capping sublayer 276A to an oxygen ambient in a manner that speeds up oxygen adsorption and/or metal-oxygen bonding, and thus reduce Q-time, while providing better control of oxygen formation on and/or in capping sublayer 276A. For example, oxygen control treatment 277 can expose capping sublayer 276A to an ozonated deionized water ($DIO_3$) treatment (i.e., a wet $DIO_3$ treatment), an oxygen annealing treatment, an oxygen radical treatment, or a combination thereof. In embodiments where oxygen control treatment 277 includes a wet $DIO_3$ treatment, capping sublayer 276A can be exposed to a $DIO_3$ solution that includes about 5 ppm to about 35 ppm $O_3$ on a weight basis relative to DI in the $DIO_3$ solution and/or to a $DIO_3$ solution for about 30 seconds to about 90 seconds. In some embodiments, the wet $DIO_3$ treatment can provide capping sublayer 276A with a saturated oxidized surface in less time than a vacuum break. In embodiments where oxygen control treatment 277 includes an oxygen annealing treatment, capping sublayer 276A can be exposed to an annealing, such as an RTA, in an $O_2$ ambient. In such embodiments, an annealing temperature can be about 450° C. to about 550° C., an annealing time can be about 10 seconds to about 20 seconds, the annealing can be performed at a relatively low pressure, such as a pressure of about 1 torr to about 50 torr, or a combination thereof. In embodiments where oxygen control treatment 277 includes an oxygen radical treatment, capping sublayer 276A can be exposed to oxygen radicals (O*) at a relatively low temperature, such as a temperature of about 100° C. to about 200° C., and/or a relatively low pressure, such as a pressure of about 1 torr to about 50 torr. In some embodiments, capping sublayer 276A is exposed to the oxygen radical treatment for about 10 seconds to about 20 seconds. In some embodiments, the oxygen radical treatment can provide capping sublayer 276A with a saturated oxidized surface in less time than a vacuum break alone and/or can provide capping sublayer 276A with a higher oxygen percentage than provided when it is exposed to the wet $DIO_3$ treatment. In some embodiments, oxygen control treatment 277 includes a vacuum break in combination with a wet $DIO_3$ treatment, an oxygen annealing treatment, an oxygen radical treatment, or a combination thereof.

Figures 21A, 21B:
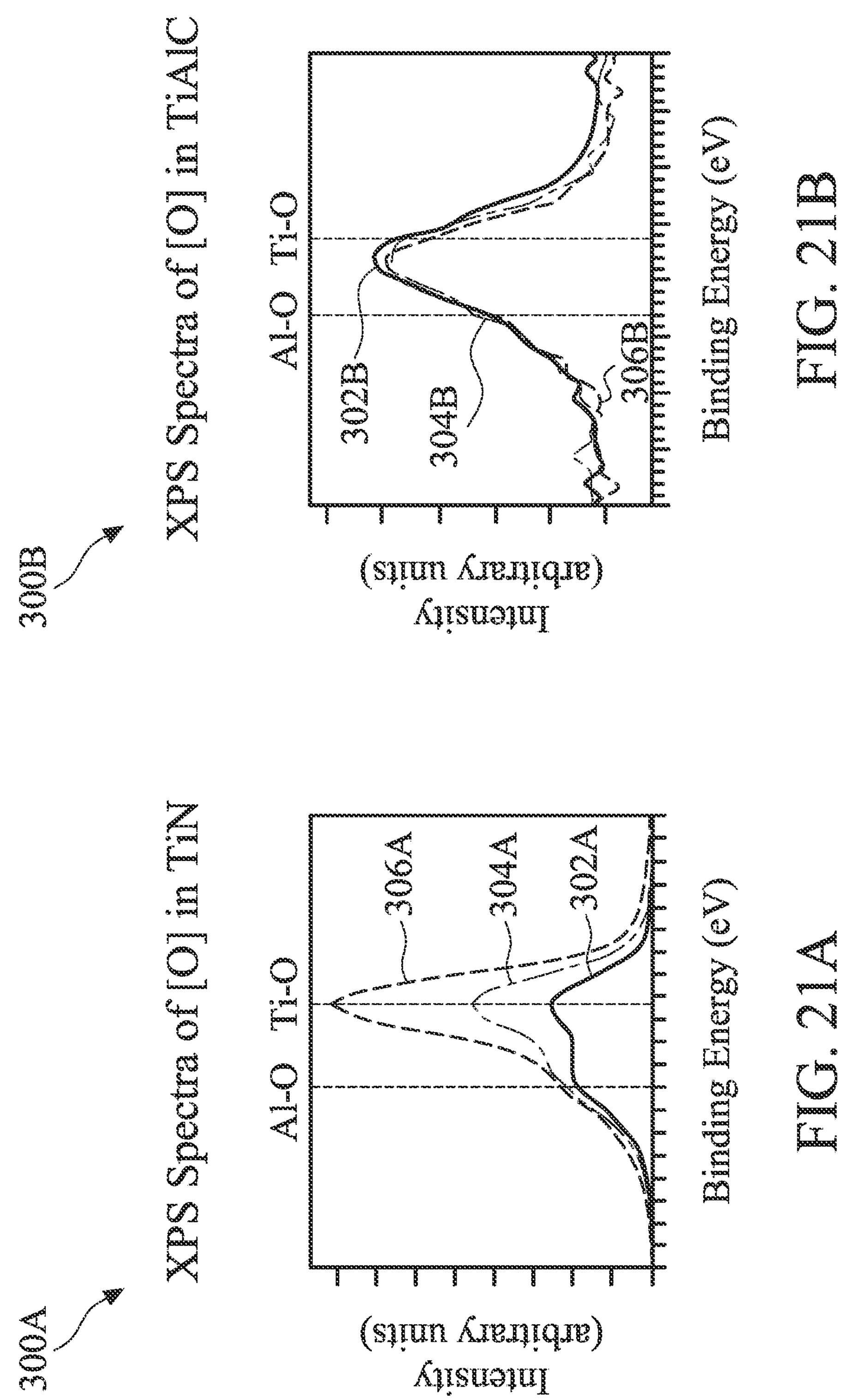
FIG. 21A and FIG. 21B depict x-ray photoelectron spectroscopy spectra of oxygen in a titanium nitride layer and a titanium aluminum carbide layer after different oxygen control treatments according to various aspects of the present disclosure.

In some embodiments, such as where capping layer 276 is a TiN layer and work function layer 272 is a TiAlC layer, parameters of oxygen control treatment 277 may be tuned to increase Ti—O bonds of capping sublayer 276A without (or negligibly) increasing Al—O bonds of work function layer 272. For example, FIG. 21A is a graph 300A of XPS spectra of oxygen in a TiN layer (e.g., capping sublayer 276A) after different oxygen control treatments, and FIG. 21B is a graph 300B is a graph 300B of XPS spectra of oxygen in a TiAlC layer (e.g., work function layer 272) after the oxygen control treatments according to various aspects of the present disclosure. Graph 300A has an x-axis representing a binding energy (in eV) of an O1s XPS spectra and a y-axis representing intensity of signals obtained from TiN layers after the oxygen control treatments. Graph 300B has an x-axis representing a binding energy (in eV) of an Al2p XPS spectra and a y-axis representing intensity of signals obtained from TiAlC layers after the oxygen control treatments. In graph 300A, a signal 302A corresponds to a TiN layer after a vacuum break, a signal 304A corresponds to a TiN layer after a wet $DIO_3$ treatment, and a signal 306A corresponds to a TiN layer after an oxygen radical treatment. In graph 300B, a signal 302B corresponds to a TiAlC layer after the vacuum break, a signal 304B corresponds to a TiAlC layer after the wet $DIO_3$ treatment, and a signal 306B corresponds to a TiAlC layer after the oxygen radical treatment. Any given technique may be more sensitive to some materials than others, and thus magnitudes of signals 302A-306C and/or signals 302B-306B may not be directly comparable. However, by comparing change in a given signal, a relative amount of a corresponding material at a given position can be determined.

In the example, graph 300A depicts a binding energy that corresponds with Al—O bonds and a binding energy that corresponds with Ti—O bonds, and graph 300B depicts a binding energy that corresponds with Al—O bonds and a binding energy that corresponds with Al—C bonds. As shown in graph 300A and graph 300B, oxygen control provided by the vacuum break, the wet $DIO_3$ treatment, and the oxygen radical treatment increases Ti—O bonds of the TiN layer with negligible impact on Al—O bonds and/or Al—C bonds of the TiAlC layer. In other words, the oxygen control treatments increase metal-oxygen bonds of the TiN layer without (or negligibly) increasing metal-oxygen bonds of the TiAlC layer and/or decreasing metal-carbon bonds of the TiAlC layer. Oxygen control treatments can thus reduce oxygen vacancies in cap 274 without undesirably altering a work function and/or threshold voltage of a gate stack, such as that provide by work function layer 272. As further shown in graph 300A, an intensity of Ti—O bonds of a TiN layer after the oxygen radical treatment is greater than an intensity of Ti—O bonds of a TiN layer after the wet $DIO_3$ treatment and an intensity of Ti—O bonds of a TiN layer after the vacuum break. Further, an intensity of Ti—O bonds of a TiN layer the wet $DIO_3$ treatment is greater than an intensity of Ti—O bonds of a TiN layer after the vacuum break. In contrast, in graph 300B, intensity differences of Al—O bonds and/or Al—C bonds of the TiAlC layers are negligible after the oxygen radical treatment, the wet $DIO_3$ treatment, and the vacuum break.

In FIG. 14A and FIG. 14B, capping sublayer 276B is formed over capping sublayer 276A. Capping sublayer 276B partially fills the top portion of gate opening 255. In the X-Z plane, capping sublayer 276B has a u-shaped profile in the top portion of gate opening 255. In the Y-Z plane, capping sublayer 276B wraps channel layers 220'. In embodiments where capping sublayer 276A does not fill remainders of air gaps 260, capping sublayer 276B can partially fill or fill air gaps 260. In such embodiments, capping sublayer 276B can surround channel layers 220' and/or capping sublayer 276B can wrap mesa 202'.

Capping sublayer 276B is also a metal-comprising layer, such as a metal nitride layer. The metal nitride layer can include TiN, TiSiN, TaSiN, TaN, TaCN, WN, WCN, other metal nitride material, or a combination thereof. In the depicted embodiment, capping sublayer 276B includes a same material as capping sublayer 276A. For example, capping sublayer 276B is a TiN sublayer. In some embodiments, a material of capping sublayer 276B is different than a a material of capping sublayer 276A. Capping sublayer 276B is formed by ALD, CVD, PVD, other process, or a combination thereof. In some embodiments, capping sublayer 276B is formed by ALD, and the ALD can implement a titanium-containing precursor (e.g., $TiCl_4$) and a nitrogen-containing precursor (e.g., $NH_3$) to form a TiN sublayer. Parameters of the ALD and/or other deposition process (e.g., precursors, a number of ALD cycles, ALD cycle time, temperature, pressure, etc.) can be tuned to obtain a desired thickness of capping sublayer 276B. A thickness of capping sublayer 276B is less than a thickness of capping sublayer 276A. In some embodiments, a thickness of capping sublayer 276B is less than about 7 Å. In some embodiments, a thickness of capping layer 276 (i.e., a sum of a thickness of capping sublayer 276A and a thickness of capping sublayer 276B) is about 15 Å to about 25 Å.

Capping sublayer 276B and capping sublayer 276A are formed "ex-situ," which generally refers to breaking vacuum between processes. For example, device 200 is contained in a vacuum-conditioned environment when forming capping sublayer 276A and forming capping sublayer 276B, but device 200 does not remain under vacuum conditions (i.e., device 200 is exposed to oxygen control treatment 277) between forming capping sublayer 276A and forming capping sublayer 276B. In other words, vacuum is broken between forming capping sublayer 276A and forming capping sublayer 276B, such that device 200 is exposed to air (e.g., atmospheric oxygen) between process steps. In some embodiments, capping sublayer 276A and capping sublayer 276B are formed in a same process chamber and vacuum is broken between forming capping sublayer 276A and forming capping sublayer 276B. In some embodiments, capping sublayer 276A and capping sublayer 276A are formed in different process chambers of an IC process tool and/or an IC process system and vacuum is broken when transferring device 200 from a process chamber for forming capping sublayer 276A to a process chamber for forming capping sublayer 276B. In some embodiments, capping sublayer 276A and capping sublayer 276B are formed in different IC process tools and/or IC process systems and vacuum is broken when transferring device 200 between the IC process tools and/or IC process systems. Because vacuum is broken when forming capping layer 276, capping layer 276 is referred to as an ex-situ capping layer, and cap 274 is referred to as an ex-situ cap.

In FIG. 15A and FIG. 15B, capping layer 278 is formed over capping layer 276 (for example, over capping sublayer 276B). Capping layer 278 partially fills the top portion of gate opening 255. In the X-Z plane, capping layer 278 has a u-shaped profile in the top portion of gate opening 255. In the Y-Z plane, capping layer 278 wraps channel layers 220'. In embodiments where capping layer 276 does not fill remainders of air gaps 260, capping layer 278 can partially fill air gaps 260 or fill remainders of air gaps 260. In such embodiments, capping layer 278 may surround channel layers 220' and/or wrap mesa 202'.

Capping layer 278 includes a material having strong oxygen affinity, which can prevent oxygen diffusion into work function layer 272 and mitigate threshold voltage shifting that may be caused by work function metal oxidation. For example, capping layer 278 is a silicon-comprising layer, which in some embodiments, can include silicon, polysilicon, amorphous silicon, or a combination thereof. In the depicted embodiment, capping layer 278 is a silicon layer. In some embodiments, capping layer 278 is formed by a silane ($SiH_4$) soak. In some embodiments, capping layer 278 is formed by a CVD or an ALD that implements a silicon-containing precursor (e.g., $SiH_4$ and/or disilane ($Si_2H_6$)) and a hydrogen-containing precursor (e.g., $H_2$) to form a silicon layer. Parameters of the deposition process (e.g., precursors, time, temperature, pressure, etc.) can be tuned to obtain a desired thickness of capping layer 278, such as a thickness of capping layer 278 that is less than a thickness of capping layer 276. In some embodiments, a thickness of capping layer 278 is about 10 Å to about 15 Å. In some embodiments, a thickness of capping layer 278 is greater than a thickness of capping layer 276. In some embodiments, a sum of a thickness of capping layer 276 and a thickness of capping layer 278 (i.e., a thickness of cap 274) is about 25 Å to about 40 Å.

Capping layer 278 and capping sublayer 276B can be formed in-situ. For example, device 200 is contained in a vacuum-conditioned environment when forming capping layer 278 and capping sublayer 276B and device 200 remains under vacuum conditions between forming capping layer 278 and forming capping sublayer 276B. In other words, vacuum is not broken between forming capping layer 278 and forming capping sublayer 276B, such that device 200 is not exposed to air between process steps. In some embodiments, capping layer 278 and capping sublayer 276B are formed in a same process chamber and device 200 remains under vacuum conditions between forming capping layer 278 and forming capping sublayer 276B. In some embodiments, capping layer 278 and capping sublayer 276B are formed in different process chambers of an IC process tool and/or an IC process system and device 200 remains under vacuum conditions when transferred therebetween. In some embodiments, capping layer 278 and capping sublayer 276B are formed in different IC process tools and/or an IC process systems and device 200 remains under vacuum conditions when moved therebetween.

It has been observed that a relative intensity of silicon in XPS spectra of a cap having an ex-situ capping layer (i.e., where vacuum is broken during formation of capping layer 276) may be weaker than a relative intensity of silicon in XPS spectra of a cap having an in-situ capping layer (i.e., where vacuum is not broken during formation of capping layer 276). Increasing a process time for forming capping layer 278 can compensate for this silicon intensity weaking. For example, to obtain a relative intensity of silicon in XPS spectra of cap 274 (i.e., an cx-situ cap) that is similar to a relative intensity of silicon in XPS spectra of an in-situ cap, capping layer 278 can be formed by performing a silane soak process for about 150 seconds to about 350 seconds, which can prevent or minimize an increase in threshold voltage (i.e., $V_t$ roll-up) of device 200. Silane soak processes performed for less than 150 seconds can result in cap 274 having a relative intensity of silicon in XPS spectra that is less than a relative intensity of silicon in XPS spectra of an in-situ cap, which can degrade the ability of capping layer 278 to prevent oxygen diffusion into work function layer 272 and thus adequately mitigate threshold voltage shifting that may be caused by work function metal oxidation.

It has further been observed that an oxygen concentration of an outer area of capping layer 276 (e.g., a portion of capping layer 276 that wraps channel layers 220', such as a portion along a top of topmost channel layer 220' and sidewalls of channel layers 220') is greater than an oxygen concentration of an inner area of capping layer 276 (i.e., portions of capping layer 276 between channel layers 220' and between channel layer 220' and mesa 202', such as portions along a bottom of topmost channel layer 220' and tops and bottoms of lower channel layers 220'). This can result because an outer area of capping sublayer 276A oxidizes at a faster rate than an inner area of capping sublayer 276A during oxidation control treatment 277. In some embodiments, a ratio of an outer area to an inner area of capping layer 276 is about 0.3 to about 0.8. In some embodiments, a ratio of an oxygen concentration of an outer area of capping layer 276 to an oxygen concentration of an inner area of capping layer 276 is about 1.1 to about 1.4.

Figures 16A, 16B:
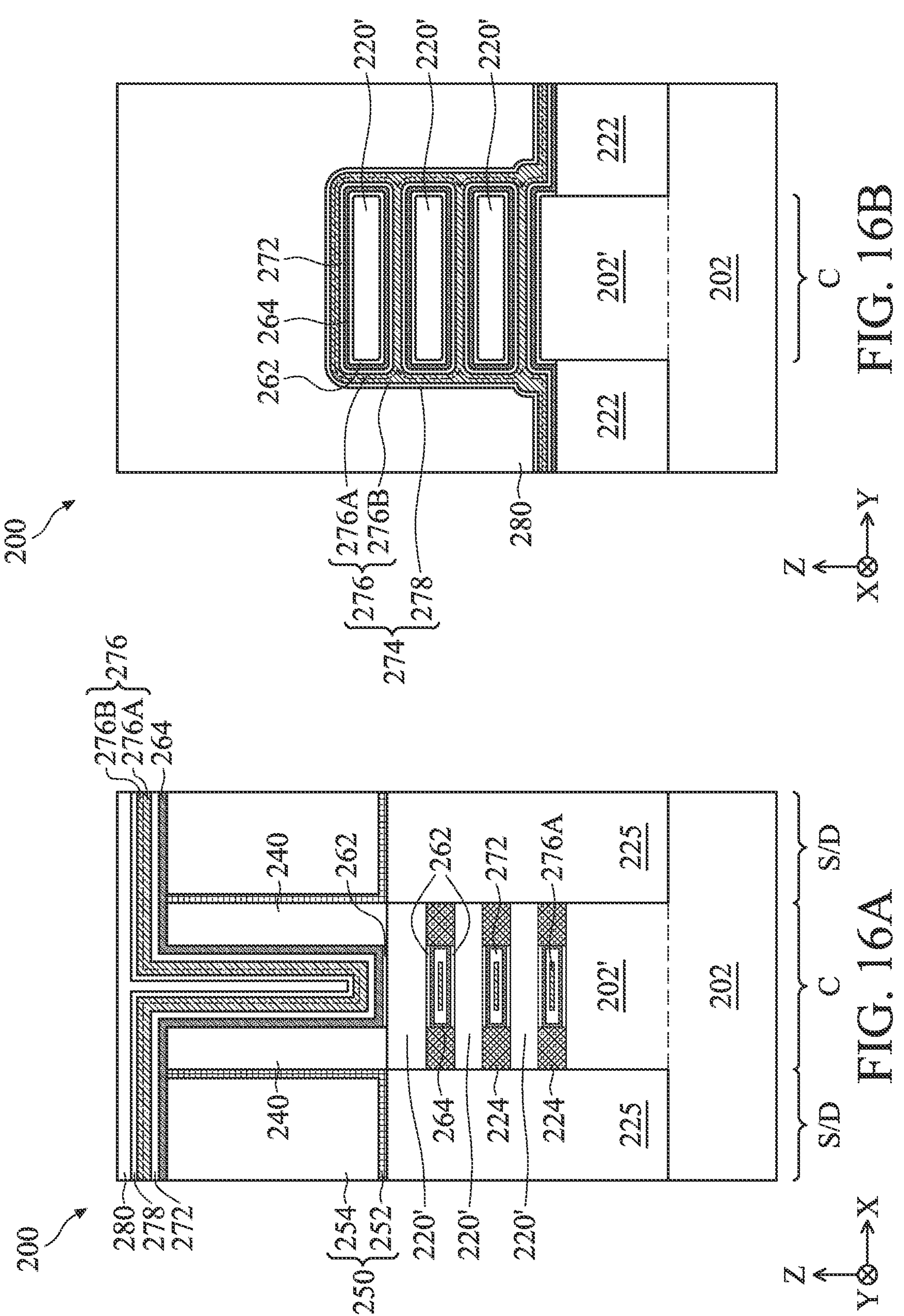

Referring to FIG. 1A, FIG. 16A, and FIG. 16B, method 100 at block 180 includes forming glue layer 280 over cap 274. Glue layer 280 fills a remainder of gate opening 255. For example, dimensions of gate opening 255, a thickness of glue layer 280, a thickness of capping layer 278, a thickness of capping layer 276, a thickness of work function layer 272, a thickness of high-k dielectric layer 264, a thickness of interfacial layer 262, dimensions of channel layers 220', or a combination thereof are configured such that glue layer 280 functions as a bulk/fill layer of the gate stack and fills remainders of gate opening 255. In the depicted embodiment, because cap 274 (e.g., capping sublayer 276A) fills remainders of air gaps 260, in the X-Z plane, glue layer 280 has a u-shaped profile in a top portion of gate opening 255, and in the Y-Z plane, wraps channel layers 220'. In embodiments where cap 274 does not fill remainders of air gaps 260, glue layer 280 can partially fill air gaps 260 or fill remainders of air gaps 260. In such embodiments, glue layer 280 may surround channel layers 220' and/or wrap mesa 202'.

Glue layer 280 can include a material that promotes adhesion between adjacent layers, such as between work function layer 272/cap 274 and a subsequently formed fill layer, and/or that prevents or eliminates diffusion and/or reaction of constituents between adjacent layers. For example, glue layer 280 includes metal and nitrogen, such as TiN, TaN, $W_2N$, TiSiN, TaSiN, other suitable metal nitride material, or a combination thereof. In the depicted embodiment, glue layer 280 is a TiN layer. Glue layer 280 is formed by ALD, CVD, PVD, other process, or a combination thereof. In some embodiments, glue layer 280 is formed by a CVD or an ALD that implements a titanium-containing precursor (e.g., $TiCl_4$) and a nitrogen-containing precursor (e.g., $NH_3$) and a temperature of about 400° C. to about 500° C. Parameters of the deposition process (e.g., precursors, time, temperature, pressure, etc.) can be tuned to obtain a desired thickness of glue layer 280, and a thickness of glue layer 280 can vary depending on a configuration of a final gate stack of device 200. For example, in the depicted embodiment, glue layer 280 fills a remainder of gate opening 255. In some embodiments, a thickness of glue layer 280 is about 10 Å to about 70 Å. In embodiments where glue layer 280 partially fills gate opening 255, glue layer 280 can have a substantially uniform thickness.

Glue layer 280 and capping layer 278 can be formed in-situ or ex-situ. In some embodiments, device 200 is contained in a vacuum-conditioned environment when forming capping layer 278 and forming glue layer 280 and device 200 remains under vacuum conditions between forming capping layer 278 and forming glue layer 280. In some embodiments, device 200 is contained in a vacuum-conditioned environment when forming capping layer 278 and when forming glue layer 280, but device 200 does not remain under vacuum conditions between forming capping layer 278 and forming glue layer 280. In some embodiments, capping layer 278 and glue layer 280 are formed in a same process chamber. In some embodiments, capping layer 278 and glue layer 280 are formed in different process chambers of an IC process tool and/or an IC process system. In some embodiments, capping layer 278 and glue layer 280 are formed in different IC process tools and/or IC process systems.

Figures 17A, 17B:
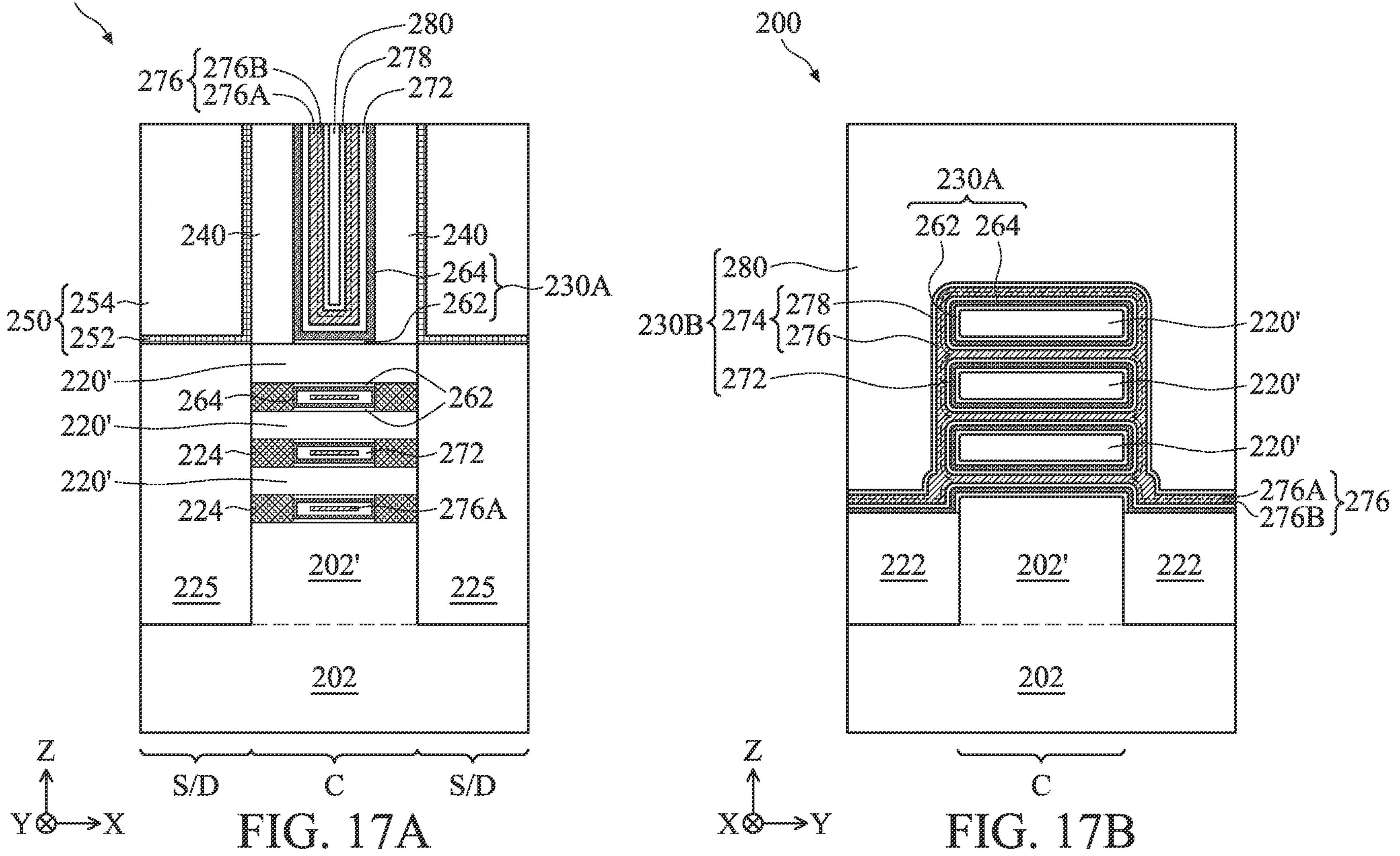

Referring to FIG. 17A and FIG. 17B, a planarization process is performed to remove excess gate materials, such as those disposed over dielectric layer 250. For example, a chemical mechanical polishing (CMP) process is performed that removes portions of glue layer 280, cap 274 (e.g., capping layer 276 and capping layer 278), work function layer 272, and high-k dielectric layer 264 disposed over dielectric layer 250. The CMP process may be performed until a top surface of dielectric layer 250 is reached (exposed). In some embodiments, the CMP process is continued and reduces a thickness of dielectric layer 250, and correspondingly, a height of gate structure 230. In the depicted embodiment, a top of gate structure 230 is substantially planar with a top of dielectric layer 250 after the CMP process, and remainders of the gate materials, which fill gate opening 255, form the gate stack of gate structure 230. As noted above, the gate stack includes gate dielectric 230A (e.g., interfacial layer 262 and high-k dielectric layer 264) and gate electrode 230B (e.g., glue layer 280, cap 274 (e.g., capping layer 276 and capping layer 278), and work function layer 272). Since gate dielectric layer 230A includes high-k dielectric layer 264, the gate stack can be referred to as a high-k/metal gate.

Figure 22:
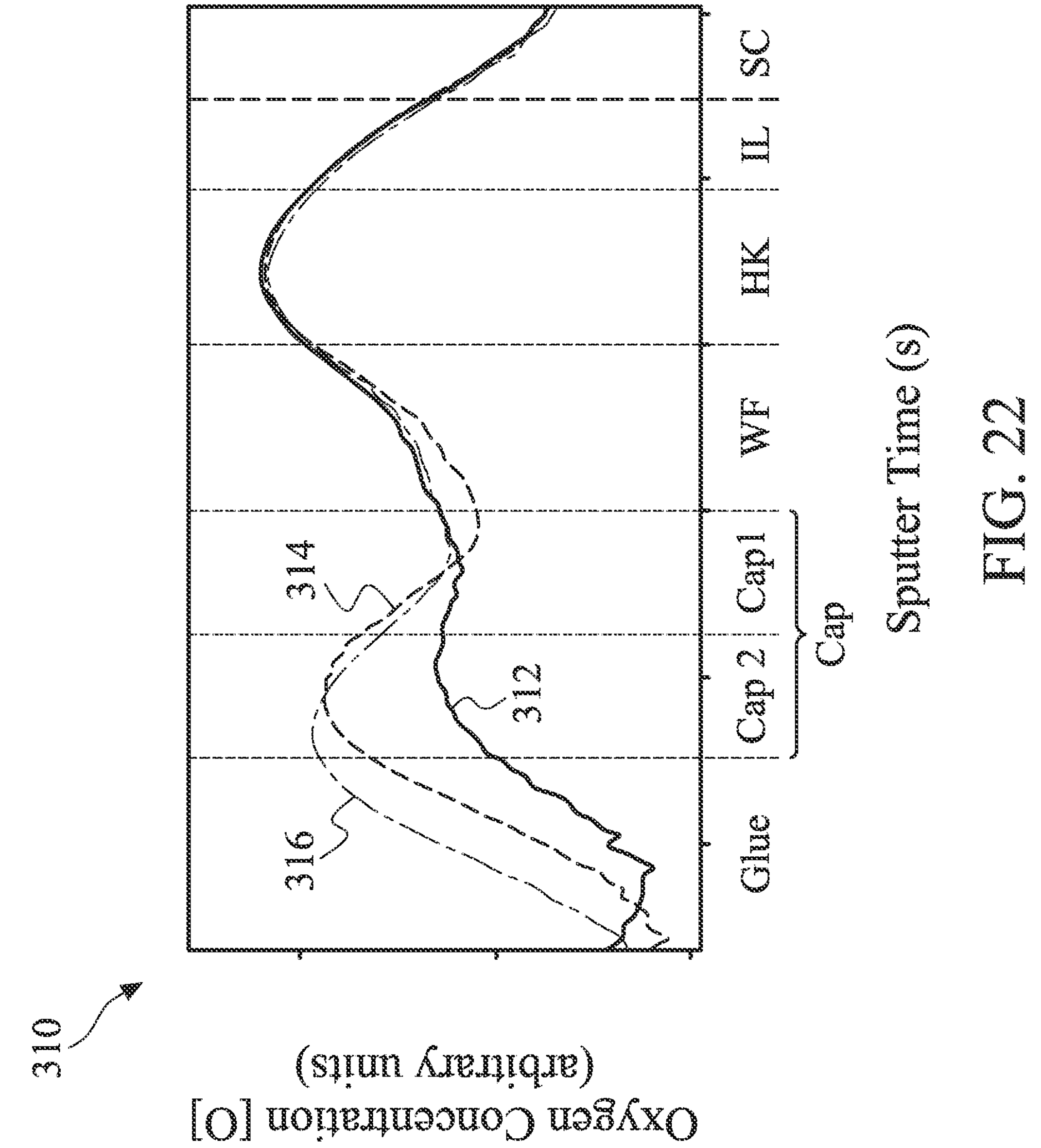
FIG. 22 depicts a secondary ion mass spectrometry (SIMS) sputtering depth profile of oxygen in gate stacks having different caps between their work function layer and their glue layer according to various aspects of the present disclosure.

Referring to FIG. 22, a graph 310 provides a secondary ion mass spectrometry (SIMS) sputtering depth profile of oxygen in gate stacks having different caps between their work function layer and their glue layer according to various aspects of the present disclosure. Graph 310 has an x-axis representing an oxygen concentration (in arbitrary units) and a y-axis representing sputtering time (in seconds). The sputtering depth profile may be taken from a top portion of a gate stack, such as that over a top channel layer, for example, proceeding through a glue layer, a cap (which can include a metal nitride layer only or a cap 1 (e.g., a metal nitride layer) and a cap 2 (e.g., a silicon layer)), a work function (WF) layer, a high-k dielectric (HK) layer, and an interfacial (IL) layer to a semiconductor (SC) layer, such as the top channel layer (e.g., top channel layer 220'). In graph 310, a curve 312 represents an oxygen concentration of a gate stack having a cap that includes a metal nitride layer but no silicon layer (i.e., a metal nitride cap), a curve 314 represents an oxygen concentration of a gate stack having an in-situ cap that includes a metal nitride layer (cap 1) and a silicon layer (cap 2) (i.e., vacuum is not broken between forming the metal nitride layer and the silicon layer), and a curve 316 represents an oxygen concentration of a gate stack having an ex-situ cap that includes a metal nitride layer (cap 1) and a silicon layer (cap 2) (i.e., vacuum is broken between forming the metal nitride layer and the silicon layer), such as the gate stack depicted in FIG. 17A and FIG. 17B.

As shown in graph 310, oxygen concentration for curve 312, curve 314, and 316 is substantially the same in the IL layer and the HK layer but varies in the WF layer, the cap, and the glue layer. In the WF layer, particularly near an interface/boundary between the WF layer and the cap/cap 1 (e.g., the metal nitride layer), oxygen concentration for curve 316 (of the gate stack employing the ex-situ cap) is substantially the same as oxygen concentration for curve 312 (of the gate stack employing a metal nitride cap only) and greater than oxygen concentration for curve 314 (of the gate stack employing the in-situ cap). Further, the oxygen concentration for curve 312, curve 314, and curve 316 decreases in the WF layer from a WF/HK interface to the WF/cap (cap1) interface. In cap 1, oxygen concentration for curve 316 is greater than oxygen concentration for curve 314 and substantially the same as oxygen concentration for curve 314 in a portion of cap 1 near the WF/cap (cap 1) interface but increases similar to and is substantially the same as oxygen concentration for curve 314 in a portion of cap 1 near an interface/boundary between the cap 1 and the cap 2 (i.e., the silicon layer). In cap 2, a peak of oxygen concentration of curve 316 is left-shifted (e.g., closer to the glue layer) relative to a peak of oxygen concentration of curve 314, such that oxygen concentration of curve 316 in cap 2 increases from the cap 1/cap 2 interface to a cap 2/GL interface, whereas oxygen concentration of curve 314 increases from the cap 1/cap 2 interface to a peak and then begins decreasing from the peak to the cap 2/GL interface. Because an oxygen concentration of the ex-situ cap is greater than an oxygen concentration of the in-situ cap, the gate stack having the ex-situ cap has less oxygen vacancies, which can mitigate unintended oxidation of gate stack layers that can negatively impact performance. Oxygen concentration for curve 312, curve 314, and 316 then decreases in the glue layer, where curve 312, curve 314, and curve 316 indicate an oxygen concentration of the glue layer of the gate stack having the ex-situ cap is greater than an oxygen concentration of the glue layer of the gate stack having the in-situ cap, which is greater than an oxygen concentration of the glue layer of the gate stack having only the metal nitride cap.

In some embodiments, processing can further include etching back gate electrode 230B and/or gate dielectric 230A and forming a hard mask, such as a self-aligned cap (SAC), over the etched-back gate electrode 230B and/or gate dielectric 230A. The hard mask can include a dielectric material, such as silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable dielectric material, or a combination thereof.

In some embodiments, processing can further include forming interconnects, such as gate contacts and/or source/drain contacts. In some embodiments, forming source/drain contacts includes forming a source/drain contact opening in dielectric layer 250 that exposes an epitaxial source/drain (e.g., epitaxial source/drain 225) and forming at least one electrically conductive layer (e.g., metal) in the source/drain contact openings. In some embodiments, the source/drain contact openings are formed by forming a patterned mask layer (e.g., an etch mask) over dielectric layer 250 and etching exposed portions of dielectric layer 250. In some embodiments, forming at least one electrically conductive layer in the source/drain contact opening includes forming a metal silicide layer over the epitaxial source/drain, depositing a barrier/liner layer that partially fills the source/drain contact opening, depositing a metal layer over the barrier/liner layer that fills remainders of the source/drain contact opening, and performing a planarization process to remove portions of the barrier/liner layer and/or the metal layer that are disposed over the top of dielectric layer 250 and/or gate structures 230. In some embodiments, one or more insulation layers may be formed in the source/drain contact opening and processed to form contact spacers, such as dielectric layers and/or air gaps, along sidewalls of electrically conductive portions of the source/drain contact (e.g., barrier layer and/or bulk metal layer).

Figures 18A, 18B:
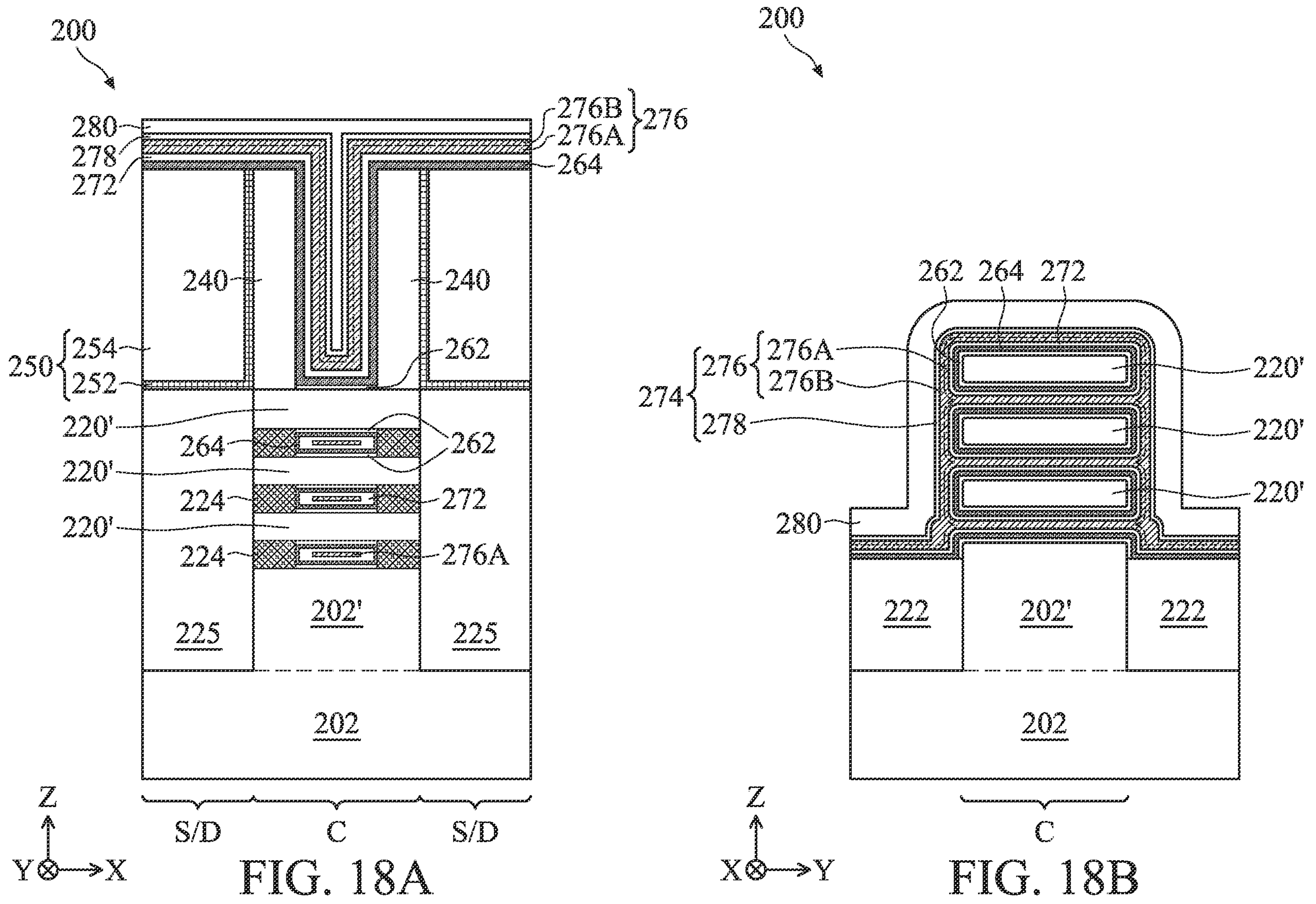

Turning to FIG. 1A, FIGS. 18A-20A, and FIGS. 18B-20B, in some embodiments, dimensions of gate opening 255, a thickness of glue layer 280, a thickness of capping layer 278, a thickness of capping layer 276, a thickness of work function layer 272, a thickness of high-k dielectric layer 264, a thickness of interfacial layer 262, dimensions of channel layers 220', or combination thereof are configured such that glue layer 282 partially fills gate opening 255. For example, in such embodiments, after forming glue layer 280 at block 180 of FIG. 1A, glue layer 280 may partially fill gate opening 255, such as depicted in FIG. 18A and FIG. 18B. In such embodiments, a thickness of glue layer 280 can be about 10 Å to about 70 Å. In some embodiments, glue layer 280 has a substantially uniform thickness along a top and sidewalls of the stack of channel layers 220' and/or around each of channel layers 220'.

Figures 19A, 19B:
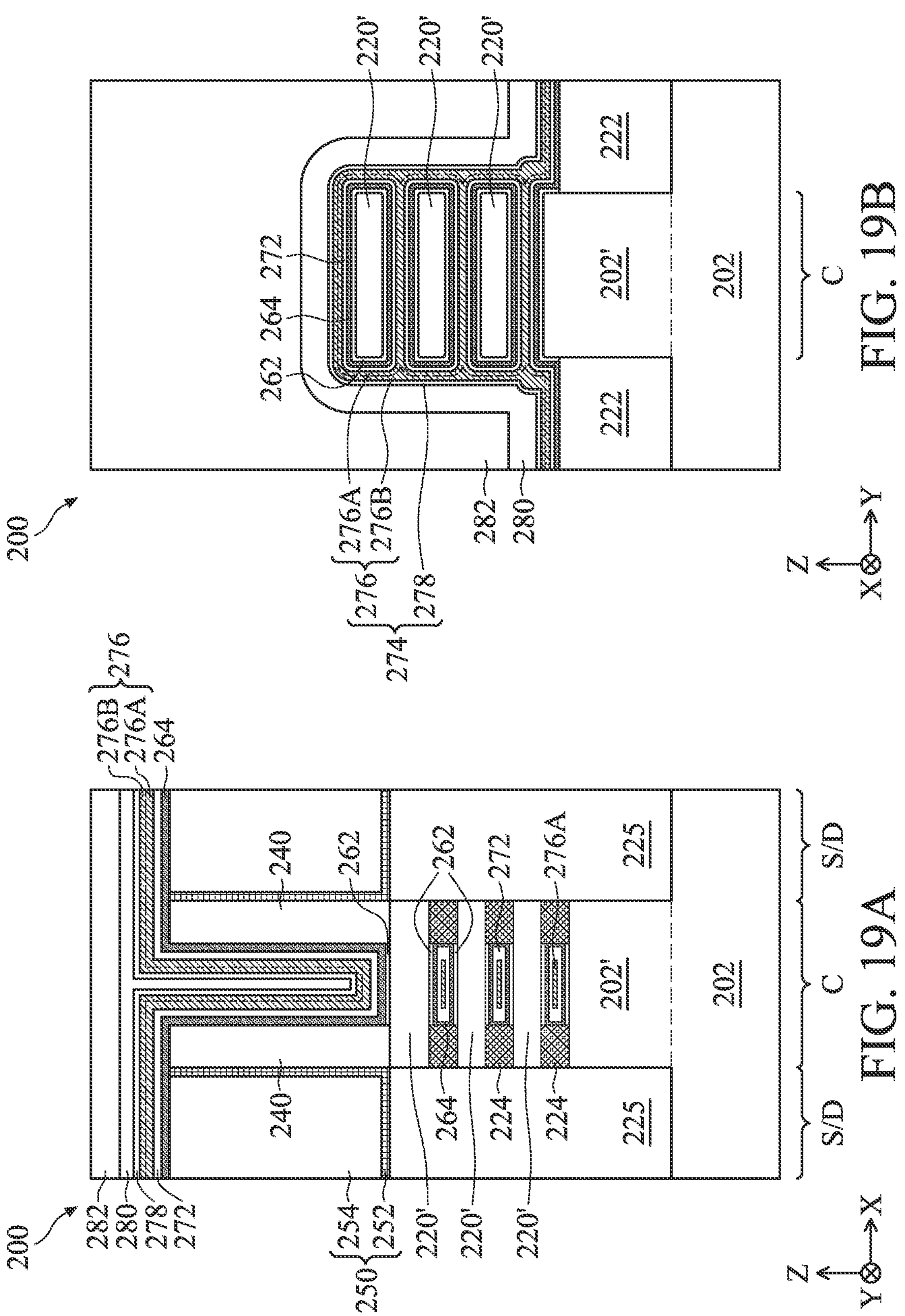

Referring to FIG. 1A, FIG. 19A, and FIG. 19B, method 100 then includes forming a bulk (fill) layer 282 over glue layer 280 at block 185. Bulk layer 282 fills a remainder of gate opening 255. Because cap 274 fills remainders of air gaps 260, bulk layer 282 has a u-shaped profile in a top portion of gate opening 255 in the X-Z plane and wraps channel layers 220' in the Y-Z plane. In embodiments where cap 274 and/or glue layer 280 do not fill remainders of air gaps 260, bulk layer 282 can partially fill air gaps 260 or fill remainders of air gaps 260. In such embodiments, bulk layer 282 may surround channel layers 220' and/or wrap mesa 202'. In some embodiments, a thickness of bulk layer 282 is about 25 Å to about 35 Å.

Bulk layer 282 includes an electrically conductive material, such as Al, W, Cu, Ti, Ta, polysilicon, other suitable metal(s) and/or alloys thereof, or a combination thereof. Bulk layer 282 is formed by ALD, CVD, PVD, other process, or a combination thereof. In some embodiments, bulk layer 282 is a tungsten layer formed by PVD or CVD. In some embodiments, bulk layer 282 is a fluorine-free tungsten (FFW) layer. In some embodiments, bulk layer 282 is performed ex-situ (e.g., vacuum is broken between forming glue layer 280 and forming bulk layer 282). In some embodiments, bulk layer 282 is performed in-situ (e.g., vacuum is not broken between forming glue layer 280 and forming bulk layer 282).

Figures 20A, 20B:
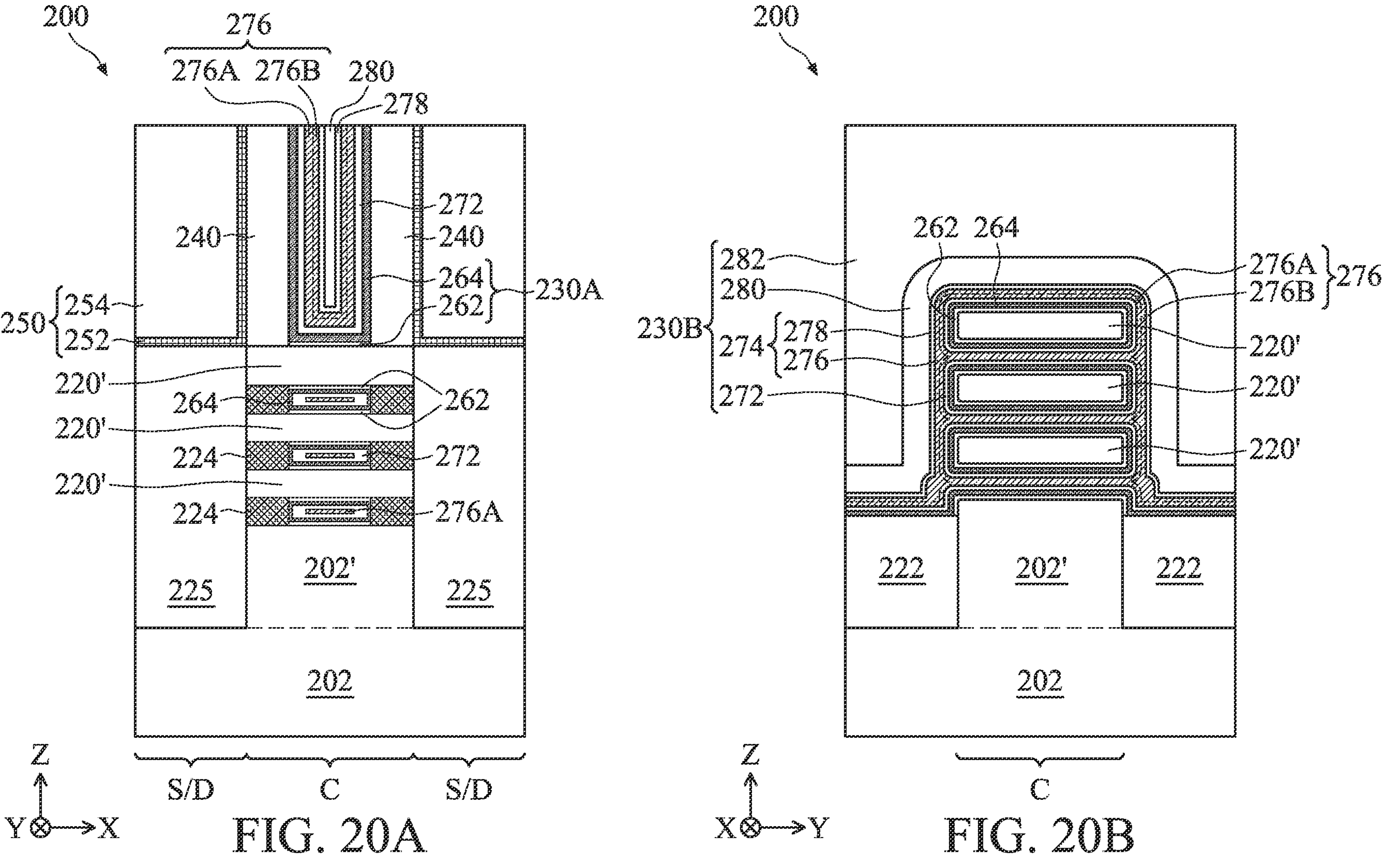

After deposition of bulk layer 282, a planarization process can be performed to remove excess gate materials, such as those disposed over dielectric layer 250, such as depicted in FIG. 20A and FIG. 20B. For example, a CMP process is performed that removes portions of bulk layer 282, glue layer 280, cap 274 (e.g., capping layer 276 and capping layer 278), work function layer 272, and high-k dielectric layer 264 disposed over dielectric layer 250. In such embodiments, the gate stack includes gate dielectric 230A (e.g., interfacial layer 262 and high-k dielectric layer 264) and gate electrode 230B (e.g., bulk layer 282, glue layer 280, cap 274 (e.g., capping layer 276 and capping layer 278), and work function layer 272).

Figure 23:
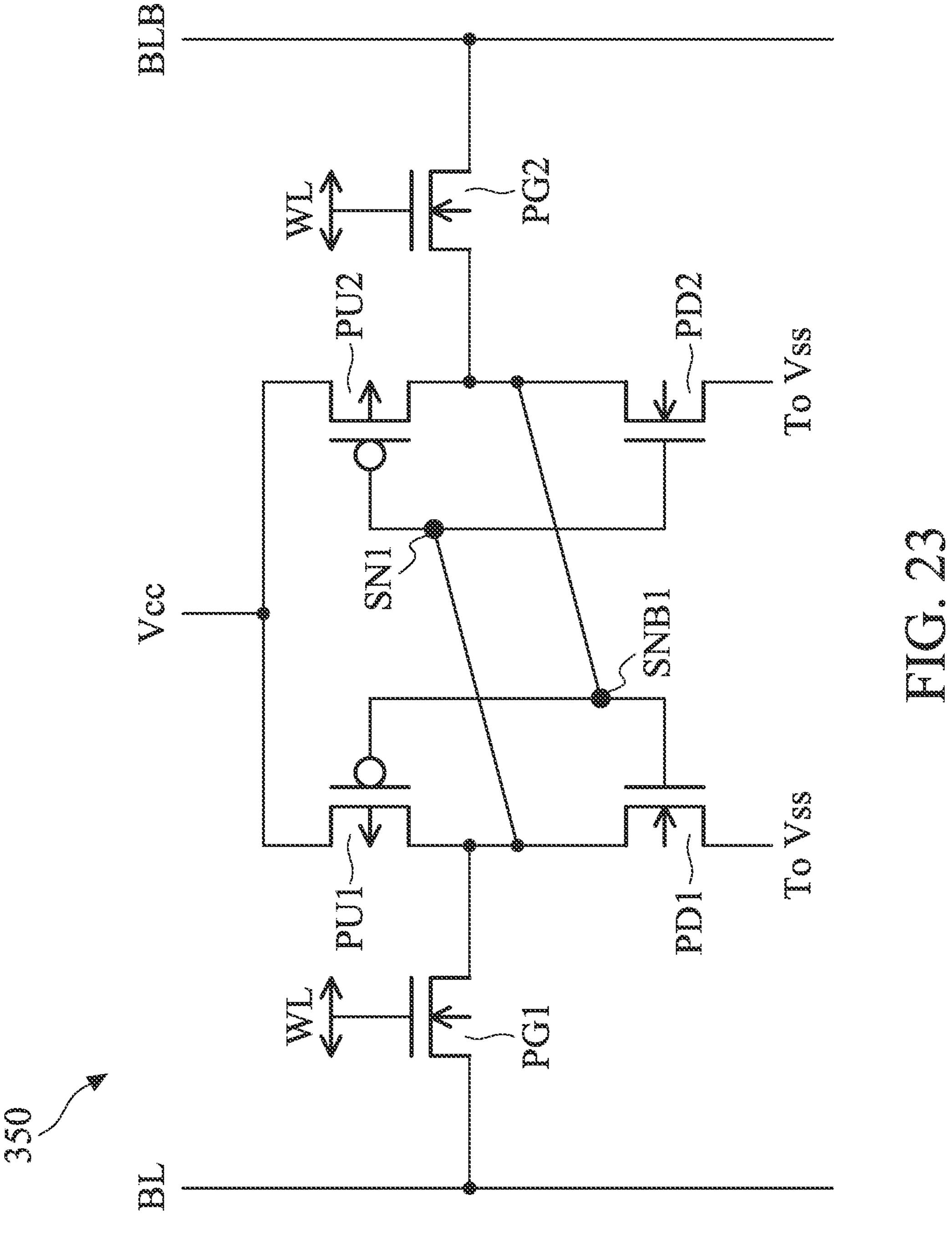
FIG. 23 illustrates an example circuit schematic of a single-port static random-access memory (SRAM) cell according to various aspects of the present disclosure.

The gate stacks of the present disclosure may be applied in various IC applications. For example, the gate stacks having ex-situ caps as described herein may be implemented in a static random-access memory (SRAM) device. An SRAM device is a type of semiconductor memory that uses bi-stable latching circuitry (e.g., flip-flop) to store binary bits of information. An SRAM cell can include pull-up (PU) transistors, pull-down (PD) transistors, and pass-gate (PG) transistors. FIG. 23 illustrates an example circuit schematic of a single-port SRAM cell (e.g., 1-bit SRAM cell) 350. Single-port SRAM cell 350 includes a pull-up transistor PU1, a pull-up transistor PU2, a pull-down transistor PD1, a pull-down transistor PD2, a pass-gate transistor PG1, and a pass-gate transistor PG2. As shown in the circuit diagram, pull-up transistor PU1 and pull-up transistor PU2 are p-type transistors, pull-down transistor PD1 and pull-down transistor PD2 are n-type transistors, and pass-gate transistor PG1 and pass-gate transistor PG2 are n-type transistors. Since SRAM cell 350 includes six transistors in the illustrated embodiment, it may also be referred to as a 6T SRAM cell.

Drains of pull-up transistor PU1 and pull-down transistor PD1 are coupled together and drains of pull-up transistor PU2 and pull-down transistor PD2 are coupled together. Pull-up transistor PU1 and pull-down transistor PD1 are cross-coupled with pull-up transistor PU2 and pull-down transistor PD2 to form a data latch. Gates of pull-up transistor PU2 and pull-down transistor PD2 are coupled together and to drains of pull-up transistor PU1 and pull-down transistor PD1 to form a storage node SN1. Gates of pull-up transistor PU1 and pull-down transistor PD1 are coupled together and to drains of pull-up transistor PU2 and pull-down transistor PD2 to form a complementary storage node SNB1. Storage node N1 and complementary storage node SNB1 are complementary nodes that are often at opposite logic levels (e.g., logic high or logic low). Sources of pull-up transistor PU1 and pull-up transistor PU2 are coupled to a power voltage Vcc (also referred to as Vdd), and sources of pull-down transistor PD1 and pull-down transistor PD2 are coupled to a voltage Vss, which in some embodiments, is an electrical ground. Storage node SN1 of the data latch is coupled to a bit line BL through pass-gate transistor PG1, and complementary storage node SNB1 of the data latch is coupled to a complementary bit line BLB through pass-gate transistor PG2. Gates of pass-gate transistor PG1 and pass-gate transistor PG2 are coupled to a word line WL.

Read and write margins of SRAM cell 350 may be impacted by transistor threshold voltage variation, transistor speed, and effective carrier mobility. According to various aspects of the present disclosure, the transistors of SRAM cell 350 can be configured with gate stacks having ex-situ caps, such as described herein, to improve its performance and reliability, for example, by reducing threshold voltage variation, increasing transistor speed, increasing effective carrier mobility, or a combination thereof, as described below. In some embodiments, pull-down transistor PD1, pull-down transistor PD2, pass-gate transistor PG1, pass-gate transistor PG2, or a combination thereof have gate stacks configured with ex-situ caps.

Figure 24:
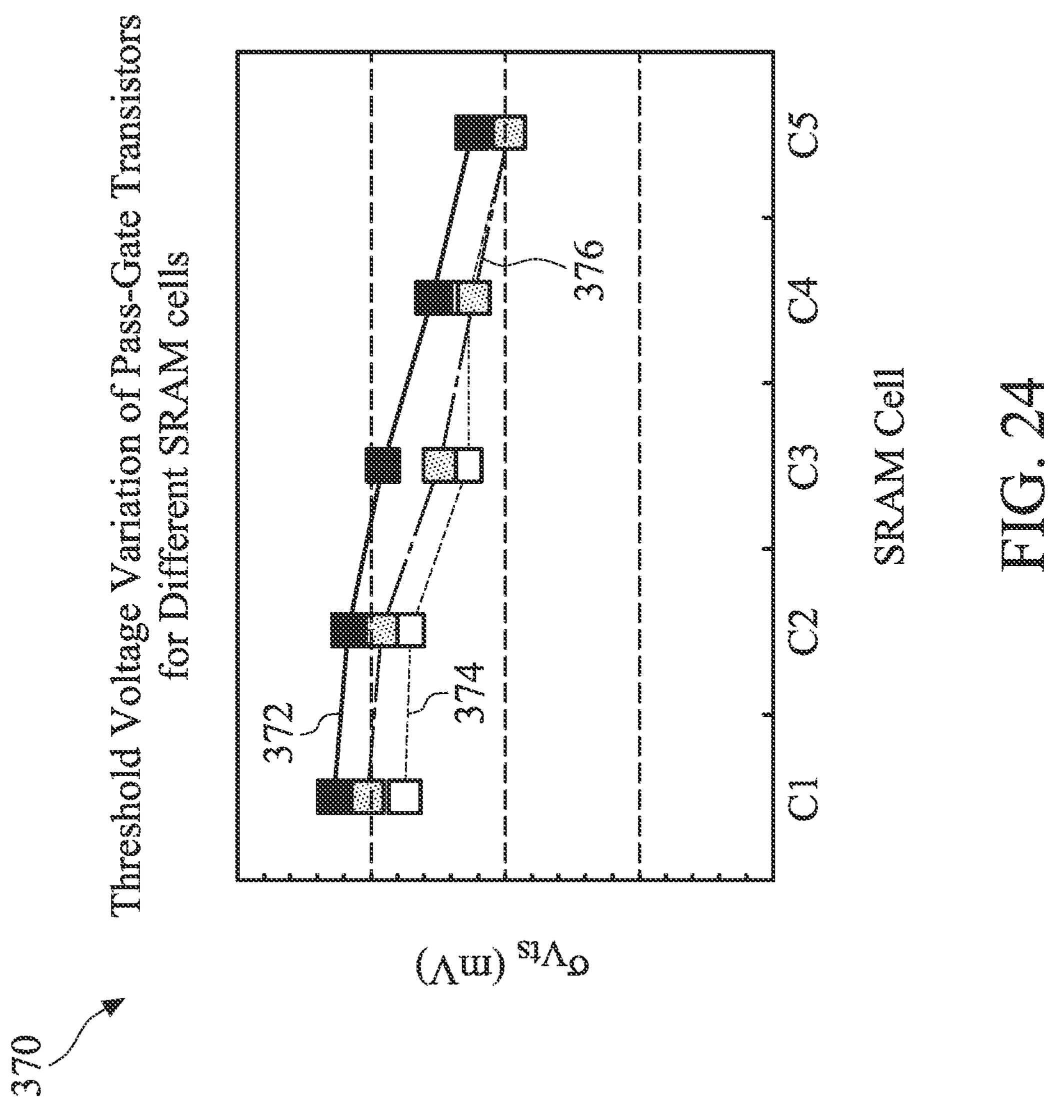
FIG. 24 is a graph that depicts threshold voltage variation for pass-gate transistors of different SRAM cells according to various aspects of the present disclosure.

FIG. 24 is a graph 370 that depicts threshold voltage variation (i.e., $\sigma_{Vts}$ or $V_{ts}$ sigma) for pass-gate transistors of different SRAM cells (e.g., an SRAM cell C1, an SRAM cell C2, an SRAM cell C3, an SRAM cell C4, and an SRAM cell C5) according to various aspects of the present disclosure. SRAM cell C1 and SRAM cell C2 have pass-gate transistors having width W1, SRAM cell C3 has pass-gate transistors having width W2, SRAM cell C4 has pass-gate transistors having width W3, and SRAM cell C5 has pass-gate transistors having width W4. Width W4 is greater than width W3, width W3 is greater than width W2, and width W2 is greater than width W1. In graph 370, a curve 372 corresponds to Vis sigma for pass-gate transistors configured with gate stacks having only a metal nitride cap (i.e., no silicon layer), a curve 374 corresponds to Vis sigma for pass-gate transistors configured with gate stacks having in-situ caps (e.g., including a silicon layer and a metal nitride layer, where vacuum is not broken between forming the layers), and a curve 376 corresponds to Vis sigma for pass-gate transistors configured with gate stacks having ex-situ caps (e.g., including a silicon layer and a metal nitride layer, where vacuum is broken between forming the layers, such as disclosed herein).

As shown by curve 372, curve 374, and curve 376, $V_{ts}$ sigma decreases as transistor width increases, and both $V_{ts}$ sigma for pass-gate transistors configured with gate stacks having in-situ caps and $V_{ts}$ sigma for pass-gate transistors configured with gate stacks having ex-situ caps are less than $V_{ts}$ sigma of pass-gate transistors configured with gate stacks having only a metal nitride cap. Further, $V_{ts}$ sigma for pass-gate transistors configured with gate stacks having ex-situ caps is slightly greater than Vts sigma for pass-gate transistors configured with gate stacks having in-situ caps for smaller transistor widths (e.g., SRAM cell C1, SRAM cell C2, and SRAM cell C3) and substantially the same as $V_{ts}$ sigma for pass-gate transistors configured with gate stacks having in-situ caps for larger transistor widths (e.g., SRAM cell C4 and SRAM cell C5). Accordingly, incorporating ex-situ caps into gate stacks of pass-gate transistors of an SRAM cell can reduce $V_{ts}$ sigma of the pass-gate transistors (though, in some instances, slightly less than that achieved by incorporating in-situ caps at smaller transistor widths) and thus improve SRAM performance, for example, by reducing SRAM operating voltage ($V_{min}$).

Figure 25:
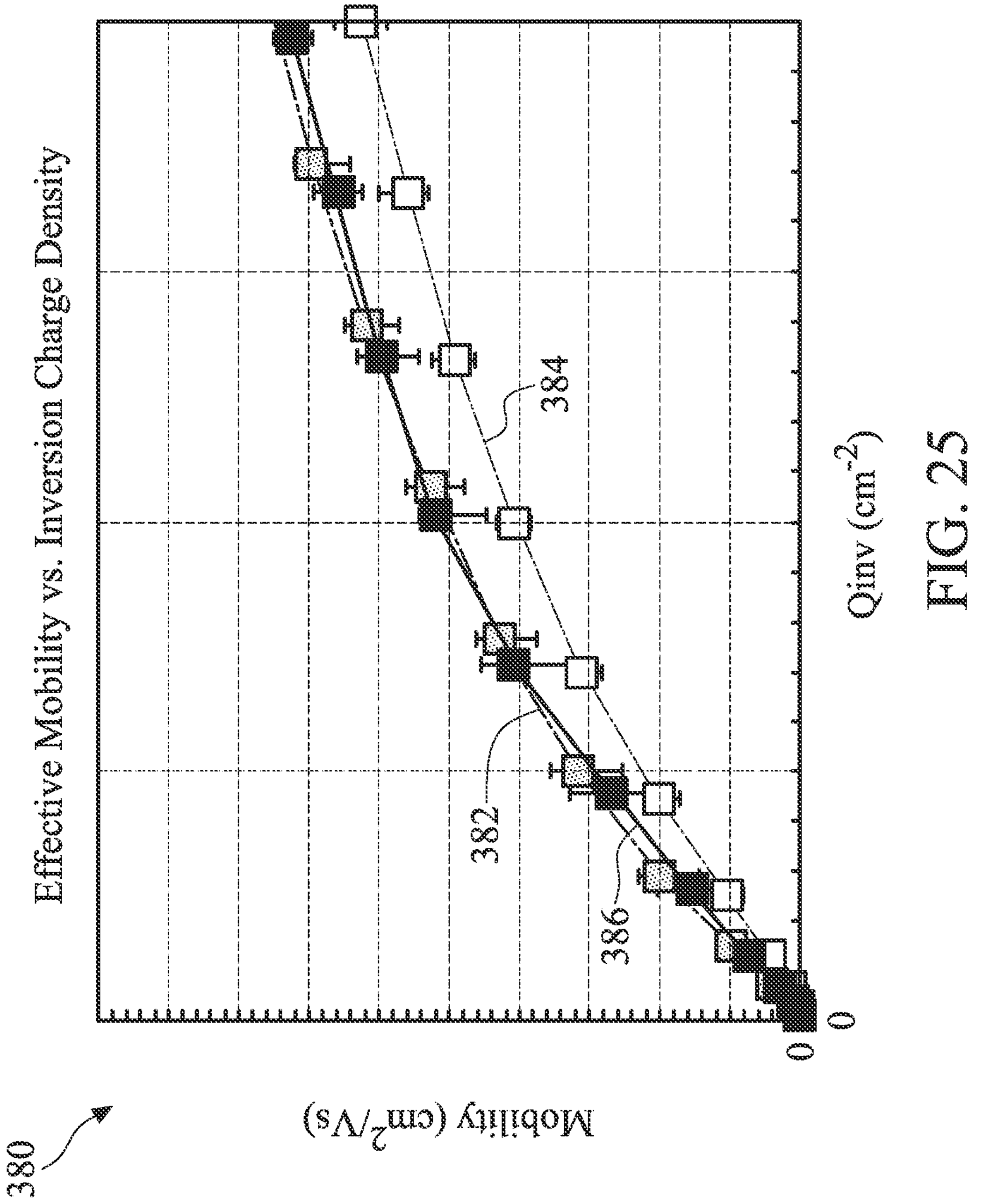
FIG. 25 is a graph that depicts effective carrier mobility as a function of inversion charge density for transistors configured with gate stacks having different caps according to various aspects of the present disclosure.

FIG. 25 is a graph 380 that depicts effective carrier mobility (in $cm^2/Vs$) as a function of inversion charge density (in $cm^{-2}$) for n-type transistors configured with gate stacks having different cap configurations according to various aspects of the present disclosure. In graph 380 and graph 390, a curve 382 corresponds to transistors configured with gate stacks having metal nitride caps only (i.e., no silicon layer), a curve 384 corresponds to transistors configured with gate stacks having in-situ caps (e.g., including a silicon layer and a metal nitride layer, where vacuum is not broken between forming the layers), and a curve 386 corresponds to transistors configured with gate stacks having ex-situ caps (e.g., including a silicon layer and a metal nitride layer, where vacuum is broken between forming the layers, such as disclosed herein).

As shown by curve 382, curve 384, and curve 386, effective carrier mobility increases as inversion charge density increases for transistors configured with gate stacks having metal nitride caps, transistors configured with gate stacks having in-situ caps, and transistors configured with gate stacks having ex-situ caps. Further, effective carrier mobility for transistors configured with gate stacks having ex-situ caps is greater than effective carrier mobility for transistors configured with gate stacks having in-situ caps and substantially the same as effective carrier mobility for transistors configured with gate stacks having metal nitride caps. In some instances, effective carrier mobility for transistors configured with gate stacks having in-situ caps is about 15% less than effective carrier mobility for transistors configured with gate stacks having metal nitride caps, which can reduce transistor speed and thus reduce SRAM read/write margins. Accordingly, as shown in graph 380, incorporating ex-situ caps into gate stacks of transistors can recover effective carrier mobility degradations seen in transistors configured with gate stacks having in-situ caps, thereby mitigating transistor speed reductions and/or enlarging SRAM read/write margins, while also enabling Vts sigma reductions as described above.

Figure 26:
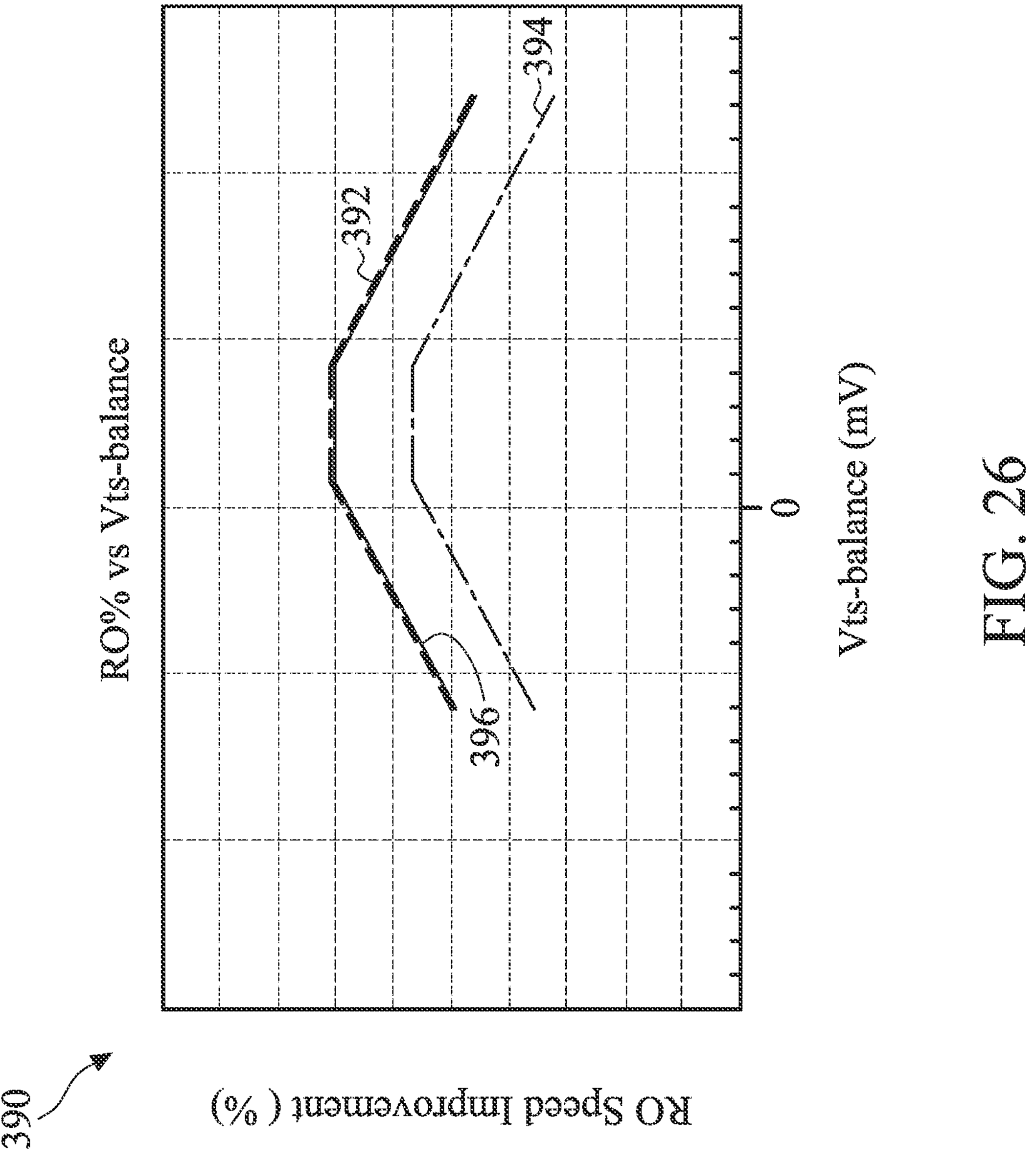
FIG. 26 is a graph that depicts ring oscillator speed improvement as a function of saturation threshold voltage, where the ring oscillators are formed of transistors configured with gate stacks having different caps, according to various aspects of the present disclosure.

Performance of transistors, such as those configured with gate stacks having ex-situ caps, can further be evaluated using ring oscillator circuits. FIG. 26 is a graph 390 that depicts ring oscillator (RO) speed improvement (in %) as a function of saturation threshold voltage ($V_{ts}$) (in mV), where the ring oscillators are formed of transistors configured with gate stacks having different cap configurations, according to various aspects of the present disclosure. In graph 390, a curve 392 corresponds to ring oscillators having transistors configured with gate stacks having metal nitride caps only (i.e., no silicon layer), a curve 394 corresponds to ring oscillators having transistors configured with gate stacks having in-situ caps (e.g., including a silicon layer and a metal nitride layer, where vacuum is not broken between forming the layers), and a curve 396 corresponds to ring oscillators having transistors configured with gate stacks having ex-situ caps (e.g., including a silicon layer and a metal nitride layer, where vacuum is broken between forming the layers, such as disclosed herein). As shown by curve 392, curve 394, and curve 396, when compared to ring oscillators having transistors configured with gate stacks having metal nitride caps only, RO speed improvement is degraded when transistors are configured with gate stacks having in-situ caps, but transistors configured with gate stacks having ex-situ caps can recover such RO speed degradation. In some instances, RO speed can be improved by about 1.5% by having transistors configured with gate stacks having ex-situ caps. Accordingly, as shown in graph 390, incorporating ex-situ caps into gate stacks of transistors can recover speed degradations seen in transistors configured with gate stacks having in-situ caps, thereby mitigating transistor speed reductions and/or enlarging SRAM read/write margins, while also enabling $V_{ts}$ sigma reductions as described above.

As shown in FIGS. 24-26, configuring gate stacks of transistors with in-situ caps can reduce threshold voltage variation (i.e., $\sigma_{Vts}$). However, such threshold voltage variation reductions may be accompanied by reduced effective carrier mobility and speed. To recover such, the present disclosure configures gate stacks of transistors with ex-situ caps such as disclosed herein. By capping a work function layer with an ex-situ cap, the gate stack (in particular, the cap and the work function layer) may have less oxygen vacancies, which can mitigate further oxidation of the cap, the work function layer, the gate dielectric, or a combination thereof during subsequent processing that can adversely impact a transistor's threshold voltage and/or performance. Configurations of the gate stacks with ex-situ caps and parameters used to form such gate stacks can further be tuned to minimize resistance and/or threshold voltage increases. For example, forming glue layer 280 and capping layer 280 in-situ, instead of ex-situ, can reduce a gate stack's resistivity by as much as 20%, thereby reducing gate resistance. In another example, configuring work function layer 272 with a low aluminum concentration (e.g., about 30% to about 40%) can reduce and/or further reduce a gate stack's resistivity, where metal resistivity decreases as aluminum concentration decreases.

Although SRAM devices are used as a non-limiting example for IC applications that could implement the various aspects of the present disclosure, other types of IC applications may also implement the various aspects of the present disclosure. For example, gate stacks having ex-situ caps as described herein may be applied to periphery logic circuit devices in an SRAM device (such as a row decoder, a column decoder, read/write circuitry, etc.), or other circuit devices, such as ring oscillators, radio frequency (RF) devices, amplifiers, mixers, analog-to-digital converters (ADCs), digital-to-analog converters (DACs), and the like. Further, devices herein, such as device 200, can may be included in a microprocessor, a memory, IC, or a combination thereof. Devices described herein, such as device 200, may be a portion of an IC chip, a system on chip (SoC), or portion thereof, that includes various passive and active microelectronic devices, such as transistors, resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other suitable components and/or devices, or a combination thereof.

The present disclosure provides for many different embodiments. Gate stacks (e.g., high-k/metal gates) having ex-situ caps and methods of fabrication thereof are described herein and provide numerous advantages. The gate stacks disclosed herein may be implemented in a variety of device types. For example, the gate stacks described herein are suitable for planar field-effect transistors (FETs), multigate transistors, such as FinFETs, GAA transistors, omega-gate (Ω-gate) devices, pi-gate (Π-gate) devices, or a combination thereof, as well as strained-semiconductor devices, silicon-on-insulator (SOI) devices, partially-depleted SOI devices, fully-depleted SOI devices, other devices, or a combination thereof.

An exemplary method for forming a gate stack of a multigate device includes forming a gate dielectric layer, forming a work function layer over the gate dielectric layer, forming a cap over the work function layer, and forming a gate electrode layer over the cap. Forming the cap includes forming a first portion of a first capping layer over the work function layer, performing an oxygen control treatment, forming a second portion of the first capping layer over the first portion of the first capping layer, and forming a second capping layer over the first capping layer. The second portion of the first capping layer is formed after performing the oxygen control treatment. The gate dielectric layer, the work function layer, the cap, and the gate electrode layer wrap a channel (e.g., a semiconductor fin or a suspended semiconductor layer, such as a nanosheet) of the multigate device. In some embodiments, the gate dielectric layer, the work function layer, and the first capping layer of the cap wrap around the channel. In some embodiments, the method includes forming a sacrificial cap over the gate dielectric layer and removing the sacrificial cap after performing a thermal treatment.

The oxygen control treatment is configured to increase a concentration of oxygen in and/or at a surface of the first portion of the first capping layer, increase metal-oxygen bonds in and/or at a surface of the first portion of the first capping layer, reduce oxygen vacancies in and/or at a surface of the first portion of the first capping layer, or a combination thereof. In some embodiments, a surface of the first portion of the first capping layer includes metal-nitrogen bonds and metal-oxygen bonds after the oxygen control treatment, such as titanium-nitrogen and titanium-oxygen bonds. In some embodiments, the oxygen control treatment includes, after forming the first portion of the first capping layer, breaking vacuum to expose the first portion of the first capping layer to an oxygen ambient. In some embodiments, the oxygen control treatment includes exposing the first portion of the first capping layer to ozonated deionized water ($DIO_3$). In some embodiments, the oxygen control treatment includes exposing the first portion of the first capping layer to oxygen radicals. In some embodiments, the oxygen control treatment includes performing an annealing in an oxygen ambient. In some embodiments, a time between forming the first portion of the first capping layer and forming the second portion of the second capping layer is about 3 hours to about 10 hours.

In some embodiments, the method includes forming the second capping layer after forming the second portion of the first capping layer without breaking vacuum. In some embodiments, the method includes forming the first portion of the first capping layer after forming the work function layer without breaking vacuum. In some embodiments, forming the first portion of the first capping layer includes depositing a first metal nitride sublayer of a metal nitride layer, forming the second portion of the first capping layer includes depositing a second metal nitride sublayer of the metal nitride layer, and forming the second capping layer includes depositing a silicon-comprising layer. In some embodiments, the method includes depositing the first metal nitride sublayer with a first thickness and depositing the second metal nitride sublayer with a second thickness, where the second thickness is less than the first thickness.

Another exemplary method includes forming an interfacial layer over a channel layer, forming a high-k dielectric layer over the interfacial layer, forming a work function layer over the high-k dielectric layer, forming a cap over the work function layer, and forming at least one electrically conductive layer over the cap. Forming the cap includes forming a first metal nitride layer over the work function layer, forming a second metal nitride layer over the first metal nitride layer after breaking vacuum, and forming a silicon-comprising layer over the second metal nitride layer. Forming the at least one electrically conductive layer includes forming a third metal nitride layer over the silicon-comprising layer. In some embodiments, the first metal nitride layer is a first titanium nitride layer, the second metal nitride layer is a second titanium nitride layer, the third metal nitride layer is a third titanium nitride layer, the silicon-comprising layer is a silicon layer, and the work function layer is a titanium aluminum carbide layer.

In some embodiments, the method includes forming the silicon-comprising layer after forming the second metal nitride layer without breaking vacuum. In some embodiments, the method includes forming the first metal nitride layer after forming the work function layer without breaking vacuum. In some embodiments, the method includes forming the third metal nitride layer after forming the silicon-comprising layer without breaking vacuum. In some embodiments, the method includes breaking vacuum between the forming the third metal nitride layer and the forming the silicon-comprising layer. In some embodiments, the method includes, before forming the second metal nitride layer over the first metal nitride layer, exposing the first metal nitride layer to an oxygen-containing environment, wherein the oxygen-containing environment is tuned to cause the first metal nitride layer to adsorb oxygen. Exposing the first metal nitride layer to the oxygen-containing environment can include exposing the first metal nitride layer to ozonated deionized water, exposing the first metal nitride layer to oxygen radicals, performing an annealing in an oxygen ambient, or a combination thereof.

An exemplary transistor includes a first channel layer and a second channel layer, a gate dielectric around the first channel layer and the second channel layer, and a gate electrode disposed over the gate dielectric. The gate dielectric includes an interfacial layer and a high-k dielectric layer. The gate electrode is around the first channel layer and the second channel layer. The gate electrode includes a work function layer disposed over the high-k dielectric layer and a cap disposed over the work function layer. The cap includes a first metal nitride layer disposed over the work function layer and a silicon layer disposed over the first metal nitride layer. A first oxygen concentration of a first portion of the cap between the first channel layer and the second channel layer (i.e., an inner portion of the cap disposed between the channel layers) is less than a second oxygen concentration of a second portion of the cap that wraps the first channel layer and the second channel layer (i.e., an outer portion of the cap disposed along sidewalls of the channel layers). In some embodiments, a ratio of the second oxygen concentration to the first oxygen concentration is about 1.1 to about 1.4. The gate electrode further includes a second metal nitride layer over the silicon layer of the cap. In some embodiments, the interfacial layer, the high-k dielectric layer, the work function layer, and the first metal nitride layer of the cap fill a gap between the first channel layer and the second channel layer. In some embodiments, the gate electrode further includes a metal layer disposed over the second metal nitride layer. The metal layer can be a tungsten layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
- forming a gate dielectric layer over a channel layer;
- forming a work function layer over the gate dielectric layer;
- forming a cap over the work function layer, wherein the forming the cap includes:
  - forming a first portion of a first capping layer,
  - after performing an oxygen control treatment, forming a second portion of the first capping layer over the first portion of the first capping layer, and
  - forming a second capping layer over the first capping layer; and
- forming a gate electrode layer over the cap.

2. The method of claim 1, wherein the performing the oxygen control treatment includes, after forming the first portion of the first capping layer, breaking vacuum to expose the first portion of the first capping layer to an oxygen ambient.

3. The method of claim 1, wherein the performing the oxygen control treatment includes exposing the first portion of the first capping layer to ozonated deionized water ($DIO_3$).

4. The method of claim 1, wherein the performing the oxygen control treatment includes exposing the first portion of the first capping layer to oxygen radicals.

5. The method of claim 1, wherein the performing the oxygen control treatment includes performing an annealing in an oxygen ambient.

6. The method of claim 1, wherein:
- the forming the first portion of the first capping layer includes depositing a first metal nitride sublayer of a metal nitride layer;
- the forming the second portion of the first capping layer includes depositing a second metal nitride sublayer of the metal nitride layer; and
- the forming the second capping layer includes depositing a silicon-comprising layer.

7. The method of claim 6, further comprising depositing the first metal nitride sublayer with a first thickness and depositing the second metal nitride sublayer with a second thickness, wherein the second thickness is less than the first thickness.

8. The method of claim 1, further comprising forming the second capping layer after forming the second portion of the first capping layer without breaking vacuum.

9. The method of claim 1, further comprising forming the first portion of the first capping layer after forming the work function layer without breaking vacuum.

10. The method of claim 1, further comprising:
- forming a sacrificial cap over the gate dielectric layer; and
- after performing a thermal treatment, removing the sacrificial cap.

11. A method comprising:
- forming an interfacial layer over a channel layer;
- forming a high-k dielectric layer over the interfacial layer;
- forming a work function layer over the high-k dielectric layer;
- forming a cap over the work function layer, wherein the forming the cap includes:
  - forming a first metal nitride layer over the work function layer,
  - after breaking vacuum, forming a second metal nitride layer over the first metal nitride layer, and forming a silicon-comprising layer over the second metal nitride layer; and forming at least one electrically conductive layer over the cap, wherein the at least one electrically conductive layer includes a third metal nitride layer.

12. The method of claim 11, further comprising forming the silicon-comprising layer after forming the second metal nitride layer without breaking vacuum.

13. The method of claim 11, further comprising forming the first metal nitride layer after forming the work function layer without breaking vacuum.

14. The method of claim 11, further comprising forming the third metal nitride layer after forming the silicon-comprising layer without breaking vacuum.

15. The method of claim 11, further comprising breaking vacuum between forming the third metal nitride layer and forming the silicon-comprising layer.

16. The method of claim 11, further comprising, before forming the second metal nitride layer over the first metal nitride layer, exposing the first metal nitride layer to an oxygen-containing environment, wherein the oxygen-containing environment is tuned to cause the first metal nitride layer to adsorb oxygen.

17. The method of claim 11, wherein:

the forming the first metal nitride layer, the forming the second metal nitride layer, and the forming the third metal nitride layer includes, respectively, forming a first titanium nitride layer, a second titanium nitride layer, and a third titanium nitride layer; and the forming the work function layer includes forming a titanium aluminum carbide layer.

18. A method comprising:

depositing a high-k dielectric layer in a gate opening, wherein the high-k dielectric layer is deposited around a first semiconductor layer and a second semiconductor layer exposed by the gate opening, and further wherein the high-k dielectric layer is deposited in a gap between the first semiconductor layer and the second semiconductor layer;

depositing a titanium aluminum carbide layer in the gate opening and the gap, wherein the titanium aluminum carbide layer is deposited on the high-k dielectric layer;

depositing a first metal nitride layer in the gate opening and the gap, wherein the first metal nitride layer is deposited on the titanium aluminum carbide layer;

after exposing the first metal nitride layer to an oxygen ambient, depositing a second metal nitride layer in the gate opening and on the first metal nitride layer;

depositing a silicon layer in the gate opening and on the second metal nitride layer; and depositing third metal nitride metal layer in the gate opening and on the silicon layer.

19. The method of claim 18, wherein the exposing the first metal nitride layer to the oxygen ambient is configured to provide the first metal nitride layer with an oxidized surface.

20. The method of claim 18, wherein the exposing the first metal nitride layer to the oxygen ambient includes exposing the first metal nitride layer to atmospheric oxygen, oxygen radicals, ozonated deionized water, or combinations thereof.

* * * * *